United States Patent
Ito et al.

(10) Patent No.: US 9,485,853 B2
(45) Date of Patent: Nov. 1, 2016

(54) WIRING SUBSTRATE HAVING A PLURALITY OF CONNECTION TERMINALS AND A FILLING MEMBER PROVIDED THEREBETWEEN

(75) Inventors: Tatsuya Ito, Kakamigahara (JP); Seiji Mori, Kounan (JP); Takahiro Hayashi, Komaki (JP); Makoto Wakazono, Niwa-gun (JP); Tomohiro Nishida, Mizuho (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 13/885,928

(22) PCT Filed: May 16, 2012

(86) PCT No.: PCT/JP2012/003201
§ 371 (c)(1),
(2), (4) Date: May 16, 2013

(87) PCT Pub. No.: WO2013/014838
PCT Pub. Date: Jan. 31, 2013

(65) Prior Publication Data
US 2014/0124242 A1 May 8, 2014

(30) Foreign Application Priority Data

Jul. 25, 2011 (JP) ................................. 2011-161877
Jan. 6, 2012 (JP) ................................. 2012-001282

(51) Int. Cl.
*H05K 1/00* (2006.01)
*H05K 1/02* (2006.01)
(Continued)

(52) U.S. Cl.
CPC ....... *H05K 1/0213* (2013.01); *H01L 23/49816* (2013.01); *H01L 23/49822* (2013.01);
(Continued)

(58) Field of Classification Search
CPC .. H05K 1/0213; H05K 1/111; H05K 3/3436; H05K 3/3452; H05K 3/4661; H01L 23/145
USPC .................... 174/250, 251, 253, 255-258
See application file for complete search history.

(56) References Cited

U.S. PATENT DOCUMENTS

| 6,228,466 B1 | 5/2001 | Tsukada et al. |
| 2005/0258551 A1 | 11/2005 | Ho et al. |

(Continued)

FOREIGN PATENT DOCUMENTS

| CN | 101982023 A | 2/2011 |
| JP | 11-54896 A | 2/1999 |

(Continued)

OTHER PUBLICATIONS

Japanese Patent Office, Notification of Reason for Rejection issued in corresponding Japanese application 2012-554547, dispatched Jul. 23, 2013.

(Continued)

*Primary Examiner* — Tremesha S Willis
(74) *Attorney, Agent, or Firm* — Stites & Harbison, PLLC; Jeffrey A. Haeberlin; James R. Hayne

(57) ABSTRACT

A wiring substrate according to the present invention includes a laminate of one or more insulation layers and one or more conductive layers and further includes a plurality of connection terminals formed on the laminate and spaced apart from one another, each having a step formed at the outer periphery of a first main surface opposite a contact surface in contact with the laminate, and a filling member provided in a filling manner between the connection terminals.

9 Claims, 25 Drawing Sheets

(a)

(b)

(51) Int. Cl.
  *H05K 1/11*    (2006.01)
  *H05K 3/40*    (2006.01)
  *H01L 23/498*  (2006.01)
  *H05K 3/34*    (2006.01)
  *H05K 3/46*    (2006.01)
  *H01L 23/14*   (2006.01)

(52) U.S. Cl.
  CPC ......... *H01L23/49827* (2013.01); *H05K 1/111* (2013.01); *H05K 3/3452* (2013.01); *H05K 3/4007* (2013.01); *H01L 23/145* (2013.01); *H01L 23/49894* (2013.01); *H01L 2924/0002* (2013.01); *H05K 3/3436* (2013.01); *H05K 3/4661* (2013.01); *H05K 2201/0195* (2013.01); *H05K 2201/099* (2013.01); *H05K 2201/09881* (2013.01); *H05K 2201/09918* (2013.01); *Y02P 70/611* (2015.11)

(56) References Cited

U.S. PATENT DOCUMENTS

| | | | |
|---|---|---|---|
| 2007/0099123 A1 | 5/2007 | Tseng et al. | |
| 2008/0251279 A1 | 10/2008 | Muramatsu et al. | |
| 2009/0078451 A1 | 3/2009 | Niki et al. | |
| 2010/0133697 A1 | 6/2010 | Nilsson | |
| 2010/0155116 A1* | 6/2010 | Kawai | H05K 1/113 174/257 |
| 2011/0000702 A1 | 1/2011 | Oikawa | |
| 2011/0051387 A1 | 3/2011 | Tachibana et al. | |
| 2011/0079419 A1* | 4/2011 | Sato | H05K 1/111 174/257 |
| 2011/0147057 A1 | 6/2011 | Takada et al. | |
| 2012/0066901 A1 | 3/2012 | Kawai et al. | |
| 2012/0313242 A1* | 12/2012 | Sakuma et al. | 257/738 |
| 2013/0164935 A1 | 6/2013 | Nilsson | |

FOREIGN PATENT DOCUMENTS

| | | | |
|---|---|---|---|
| JP | 2002353593 A | 12/2002 | |
| JP | 2003332720 A | 11/2003 | |
| JP | 2006344889 A | 12/2006 | |
| JP | 2007149998 A | 6/2007 | |
| JP | 2008-140886 A | 6/2008 | |
| JP | 2009212228 A | 9/2009 | |
| JP | 2010-153863 A | 7/2010 | |
| TW | 200718317 A | 5/2007 | |
| TW | 200910569 A | 3/2009 | |
| TW | 200950031 A | 12/2009 | |
| WO | 2009/037939 A1 | 3/2009 | |

OTHER PUBLICATIONS

JPO/ISA, International Search Report issued in corresponding international application PCT/JP2012/003201, mailed Jun. 19, 2012.

European Patent Office, Extended European Search Report issued in the corresponding European application No. 12817081.8, dated Feb. 12, 2015.

Taiwan Patent Office, Notification for the Opinion of Examination issued in corresponding Taiwanese application No. 101126537, mailed Aug. 20, 2014.

Taiwan Intellectual Property Office, Notification for the Opinion of Examination, issued in corresponding Taiwanese application No. 101113546, mailed Oct. 28, 2014.

The State Intellectual Property Office of P.R. China, Notification of the Second Office Action issued in corresponding ahinese Application No. 201280003901, mailed Dec. 30, 2015.

* cited by examiner (a)

(b)

(a)

(b)

(a)

(b)

(a)

(b)

(a)

(b)

(a)

(b)

(a)

(b)

(a)

(b)

(a)

(a)

(a)

(b)

(a)

(b)

WIRING SUBSTRATE HAVING A PLURALITY OF CONNECTION TERMINALS AND A FILLING MEMBER PROVIDED THEREBETWEEN

TECHNICAL FIELD

The present invention relates to a wiring substrate having a plurality of connection terminals formed on its main surface for connection to a semiconductor chip.

BACKGROUND ART

Usually, a wiring substrate has terminals formed on its main surface (front surface) for connection to a semiconductor chip (hereinafter referred to as connection terminals). In recent years, the disposition density of the connection terminals has been increasing; accordingly, the pitch between the connection terminals to be disposed has become finer. Thus, there is proposed a wiring substrate which employs the NSMD (non solder mask defined) feature in which a plurality of connection terminals are disposed within the same opening.

However, in the case where a plurality of connection terminals are disposed at a fine pitch within the same opening, solder coated on the surface of a certain connection terminal may flow to an adjacent connection terminal, potentially resulting in the occurrence of a short circuit between the connection terminals. In order to prevent flow of solder coated on the surface of a certain connection terminal to an adjacent connection terminal, insulating partition walls are provided between connection terminals (refer to, for example, Patent Document 1).

PRIOR ART DOCUMENT

Patent Document

Patent Document 1: Japanese Patent Application Laid-Open (kokai) No. 2009-212228

SUMMARY OF THE INVENTION

Problems to be Solved by the Invention

When solder is coated on the connection terminals, solder assumes a spherical shape (ball shape) by the effect of surface tension; in the case of the wiring substrate described in Patent Document 1, since solder is coated on the upper surfaces and side surfaces of the connection terminals, solder coated on the connection terminals has a large diameter. Accordingly, pitch spacings between the connection terminals must be wide; thus, difficulty is encountered in implementing a finer-pitch disposition of the connection terminals.

Also, in the wiring substrate described in Patent Document 1, in order to coat solder on the upper surfaces and side surfaces of the connection terminals, the upper surfaces and side surfaces of the connection terminals are exposed. That is, the connection terminals are bonded only at their lower surfaces to the ground resin. However, as mentioned above, since a pitch between the connection terminals is fine, the connection terminals are small in size. Thus, as in the case of the wiring substrate described in Patent Document 1, in a state in which the connection terminals are bonded only at their lower surfaces to the ground resin, a sufficient bonding strength fails to be obtained, potentially resulting in separation of the connection terminals in the course of manufacture.

The present invention has been conceived to cope with the above circumstances, and an object of the invention is to provide a wiring substrate configured to prevent the occurrence of a short circuit between the connection terminals and to implement a fine-pitch disposition of the connection terminals.

Means for Solving the Problems

To achieve the above object, the present invention provides a wiring substrate comprising a laminate of one or more insulation layers and one or more conductive layers, characterized by further comprising a plurality of connection terminals formed on the laminate and spaced apart from one another, each having a step formed at an outer periphery of a first main surface opposite a contact surface in contact with the laminate, and a filling member provided in a filling manner between the connection terminals.

According to the present invention, since the filling member is provided in a filling manner between the connection terminals, at the time of connection to a semiconductor chip, there can be prevented the generation of voids in regions between the connection terminals of an underfill, an NCP (Non-Conductive Paste), or an NCF (Non-Conductive Film) applied to fill a gap between the semiconductor chip and the wiring substrate. Therefore, there can be prevented the occurrence of a short circuit between the connection terminals which could otherwise result from flow of solder into the voids during reflow. Also, since the connection terminals are reduced in the area of exposure, solder coated on the individual connection terminals does not increase in diameter, whereby the connection terminals can be disposed at a fine pitch. Additionally, in forming a metal plating layer on the surfaces of the connection terminals, there can be prevented plating sag in which plating is deposited also on a surface of the laminate located between the connection terminals, as well as undercut in which side surfaces of the connection terminals are etched in regions located toward the lower surfaces of the connection terminals. Furthermore, since each of the connection terminals has a step formed at the outer periphery of the first main surface opposite the contact surface in contact with the laminate, solder coated on the individual connection terminals does not increase in diameter, whereby the connection terminals can be disposed at a finer pitch.

In a mode of the present invention, the filling member can be brought in contact with at least a portion of side surfaces of each of the connection terminals. By means of the filling member being brought in contact with at least a portion of the side surfaces of each of the connection terminals, there can be prevented a state in which the connection terminals are bonded only at their lower surfaces to the ground resin. Therefore, the connection terminals are improved in bonding strength, thereby restraining potential separation of the connection terminals in the course of manufacture.

In another mode of the present invention, each of the connection terminals is roughened at at least a portion of the contact surface in contact with the filling member. By means of each of the connection terminals being roughened at at least a portion of the contact surface in contact with the filling member, bonding strength between the connection terminals and the filling member is improved. Therefore, the connection terminals are improved in bonding strength, thereby restraining potential separation of the connection terminals in the course of manufacture.

In a further mode of the present invention, the filling member functions as solder resist. By virtue of the filling member functioning as solder resist, there can be restrained the occurrence of a short circuit between the connection terminals which could otherwise result from solder remaining on the filling member.

Furthermore, the laminate is covered with a solder resist layer having an opening from which the connection terminals are exposed, and covering a wiring pattern connected to the connection terminals. By means of the wiring pattern being covered with the solder resist layer, which is an insulation member, the occurrence of a short circuit of the wiring pattern can be prevented.

Effects of the Invention

As described above, the present invention can provide a wiring substrate configured to prevent the occurrence of a short circuit between the connection terminals and to implement a fine-pitch disposition of the connection terminals.

MODES FOR CARRYING OUT THE INVENTION

Embodiments of the present invention will next be described in detail with reference to the drawings. The embodiments of the present invention will be described while mentioning wiring substrates configured such that build-up layers are formed on a core substrate; however, no particular limitation is imposed on the wiring substrates, so long as the wiring substrates have a plurality of connection terminals whose upper surfaces and side surfaces are exposed; for example, it may be the case that a wiring substrate does not have a core substrate.

First Embodiment

Figure 1:
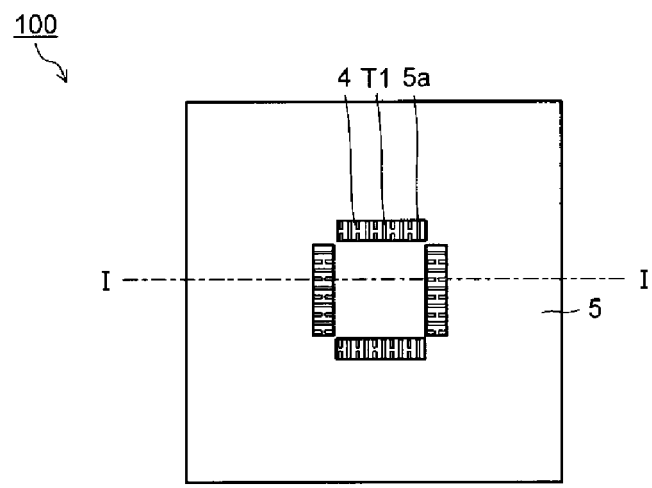
FIG. 1 Plan view (front side) of a wiring substrate according to a first embodiment.
Figure 2:
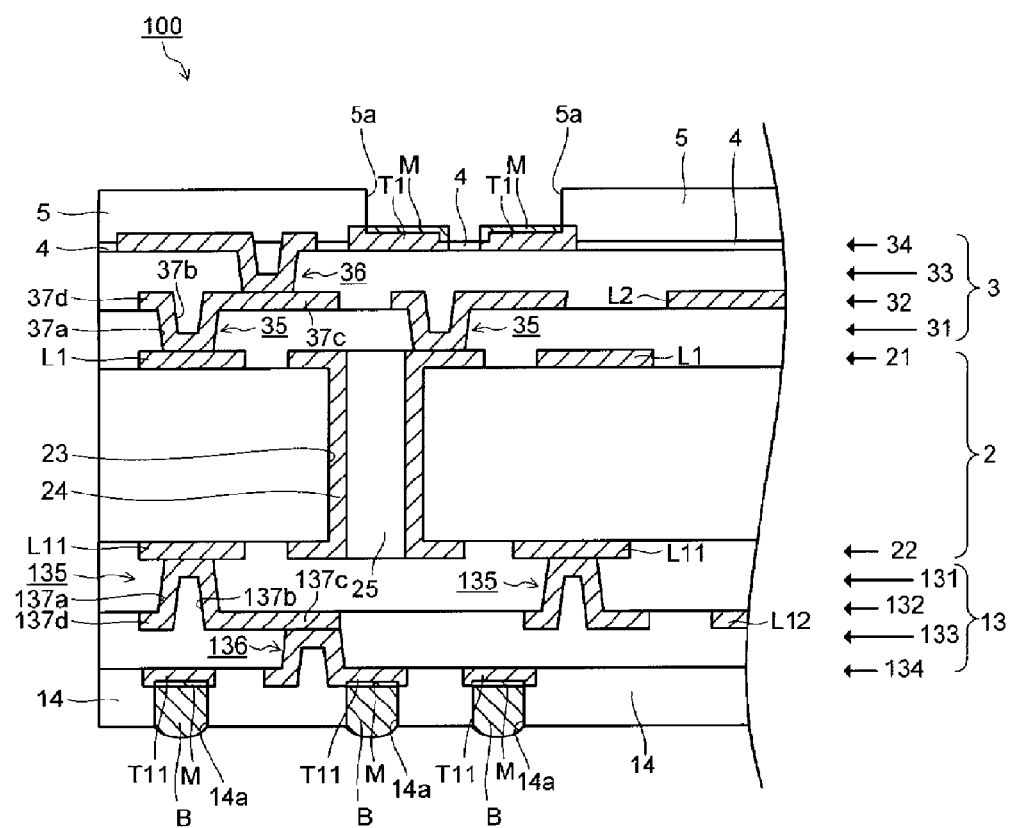
FIG. 2 Fragmentary, sectional view of the wiring substrate according to the first embodiment.
Figure 3:
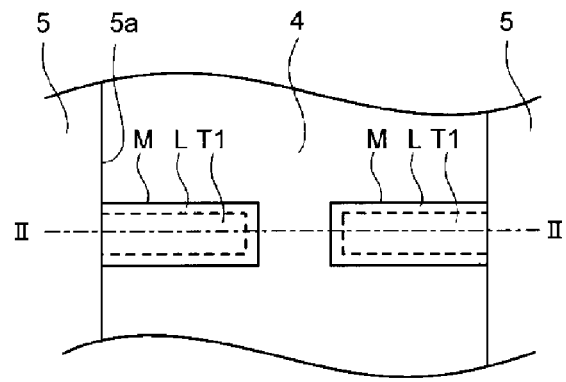
FIG. 3 A pair of configurational views of connection terminals on the front side of the wiring substrate according to the first embodiment.
Figure 3:
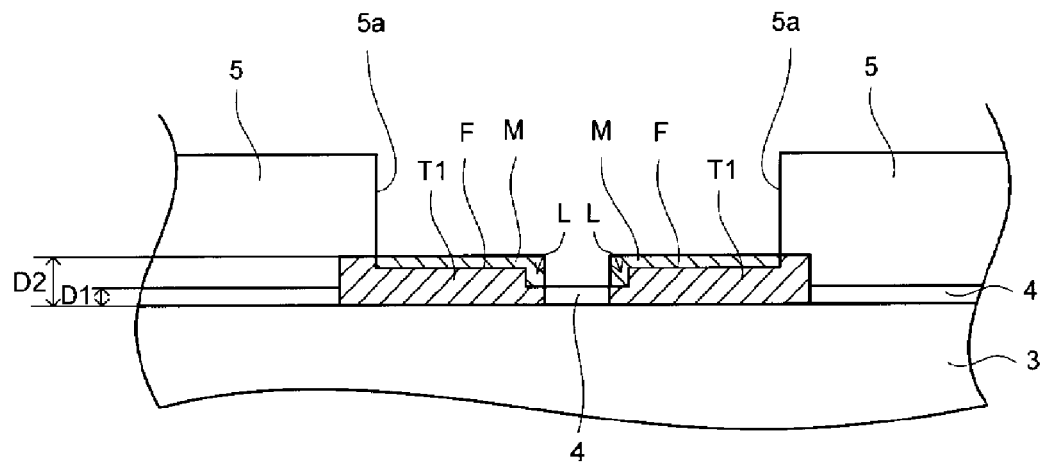

FIG. 1 is a plan view (front side) of a wiring substrate 100 according to a first embodiment. FIG. 2 is a fragmentary, sectional view of the wiring substrate 100 taken along line I-I of FIG. 1. FIG. 3 is a pair of configurational views of connection terminals T1 formed on the front side of the wiring substrate 100. FIG. 3(a) is a top view of the connection terminals T1. FIG. 3(b) is a sectional view taken along line II-II of FIG. 3(a). In the following description, a side of the wiring substrate 100 on which a semiconductor chip is connected is referred to as the front side, and a side on which a motherboard, a socket, or the like (hereinafter, referred to as a motherboard or the like) is connected is referred to as the back side.

(Configuration of the Wiring Substrate 100)

The wiring substrate 100 shown in FIGS. 1 to 3 includes a core substrate 2; a build-up layer 3 (front side) on which a plurality of the connection terminals T1 are formed for connection to a semiconductor chip (not shown) and which is laminated on the front side of the core substrate 2; a filling member 4 laminated on the build-up layer 3 and provided in a filling manner between the connection terminals T1; a solder resist layer 5 laminated on the filling member 4 and having openings 5a from which at least a portion of each of the connection terminals T1 is exposed; a build-up layer 13 (back side) on which a plurality of connection terminals T11 are formed for connection to a mother board or the like (not shown) and which is laminated on the back side of the core substrate 2; and a solder resist layer 14 laminated on the build-up layer 13 and having openings 14a from which at least a portion of each of the respective connection terminals T11 is exposed.

The core substrate 2 is a platelike resin substrate formed of a heat-resistant resin plate (e.g., a bismaleimide-triazine resin plate), a fiber-reinforced resin plate (e.g., a glass-fiber-reinforced epoxy resin), or the like. Core conductive-layers 21 and 22, which form metal wirings L1 and L11, are formed on the front surface and the back surface, respectively, of the core substrate 2. The core substrate 2 has through-holes 23 formed by drilling or the like; a through-hole conductor 24 is formed on the inner wall surface of each of the through-holes 23 for establishing electrical communication between the core conductive-layers 21 and 22. Furthermore, the through-holes 23 are filled with a resin filler 25 such as epoxy resin or the like.

(Configuration on the Front Side)

The build-up layer 3 is composed of resin insulation layers 31 and 33 and conductive layers 32 and 34 laminated on the front side of the core substrate 2. The resin insulation layer 31 is formed from a thermosetting resin composition, and the conductive layer 32, which forms metal wiring L2, is formed on the front surface of the resin insulation layer 31. The resin insulation layer 31 has vias 35 for electrically connecting a core conductive-layer 21 and the conductive layer 32. The resin insulation layer 33 is formed from a thermosetting resin composition, and the conductive layer 34 having a plurality of the connection terminals T1 is formed on the surface of the resin insulation layer 33. The resin insulation layer 33 has vias 36 for electrically connecting the conductive layer 32 and the conductive layer 34. The resin insulation layers 31 and 33 and the conductive layer 32 constitute a laminate.

Each of the vias 35 and 36 has a via hole 37a, and a via conductor 37b provided on the inner circumferential surface of the via hole 37a; a via pad 37c provided in such a manner as to electrically communicate with the via conductor 37b at its bottom; and a via land 37d projecting outward from an opening edge of the via conductor 37b on a side opposite the via pad 37c.

The connection terminals T1 are used for connection to a semiconductor chip. The connection terminals T1 are of a so-called peripheral type and are disposed along the inner periphery of a semiconductor chip mounting region. The semiconductor chip is electrically connected to the connection terminals T1, thereby being mounted on the wiring substrate 100. In order to improve adhesion to the filling member 4, which will be described later, the connection terminals T1 are roughened at their surfaces.

Even in the case where the connection terminals T1 are not roughened at their surfaces, adhesion to the filling member 4, which will be described later, can be improved by the following method: after the connection terminals T1 are coated at their surfaces with any one metal element selected from among Sn (tin), Ti (titanium), Cr (chromium), and Ni (nickel) to thereby form a metal layer, the metal layer surface is treated with a coupling agent. The coupling agent improves adhesion mainly of metal and inorganic materials to organic materials, such as resin. Examples of a coupling agent include a silane coupling agent, a titanate coupling agent, and an aluminate coupling agent; however, use of a silane coupling agent is preferred. Examples of a silane coupling agent include aminosilane, epoxysilane, and styrenesilane.

Each of the connection terminals T1 has a step L formed at the outer periphery of a first main surface F opposite a contact surface in contact with the resin insulation layer 33 of the build-up layer 3, and the exposed surface of the connection terminal T1 including the step L is covered with a metal plating layer M. In mounting a semiconductor chip on the wiring substrate 100, solder coated on the connection terminals of the semiconductor chip is reflowed, thereby electrically connecting the connection terminals of the semiconductor chip and the corresponding connection terminals T1. The metal plating layer M is composed of, for example, a single metal layer or a plurality of metal layers selected from among an Ni layer, an Sn layer, an Ag layer, a Pd layer, an Au layer, etc. (e.g., Ni layer/Au layer or Ni layer/Pd layer/Au layer). Also, in place of use of the metal plating layer M, an anticorrosive OSP (Organic Solderability Preservative) treatment may be applied. Also, solder may be coated on the exposed surfaces of the connection terminals T1 including the steps L; furthermore, after the exposed surfaces of the connection terminals T1 including the steps L are covered with the metal plating layer M, the metal plating layer M may be coated with solder. A method of coating solder on the exposed surfaces of the connection terminals T1 will be described later.

The filling member 4 is an insulating member laminated on the build-up layer 3, and the material of the filling member 4 is preferably the same as that of the solder resist layer 5. The filling member 4 is provided in a filling manner between the connection terminals T1 in a state of adhesion to the side surfaces of the connection terminals T1 formed on the surface of the build-up layer 3. The thickness D1 of the filling member 4 is smaller than the thickness (height) D2 of the connection terminals T1.

The solder resist layer 5 covers the wiring pattern connected to the connection terminals T1 and has the openings 5a from which are exposed the connection terminals T1 disposed along the inner periphery of a mounting region for a semiconductor chip. The openings 5a of the solder resist layer 5 are of the NSMD type such that a plurality of the connection terminals T1 are disposed within the same opening 5a.

(Configuration on the Back Side)

The build-up layer 13 is composed of resin insulation layers 131 and 133 and conductive layers 132 and 134 laminated on the back side of the core substrate 2. The resin insulation layer 131 is formed from a thermosetting resin composition, and the conductive layer 132, which forms metal wiring L12, is formed on the back surface of the resin insulation layer 131. The resin insulation layer 131 has vias 135 for electrically connecting a core conductive-layer 22 and the conductive layer 132. The resin insulation layer 133 is formed from a thermosetting resin composition, and the conductive layer 134 having one or more connection terminals T11 is formed on the surface of the resin insulation layer 133. Vias 136 for electrically connecting the conductive layer 132 and the conductive layer 134 are formed in the resin insulation layer 133.

Each of the vias 135 and 136 has a via hole 137a, and a via conductor 137b provided on the inner circumferential surface of the via hole 137a; a via pad 137c provided in such a manner as to electrically communicate with the via conductor 137b at its bottom; and a via land 137d projecting outward from an opening edge of the via conductor 137b on a side opposite the via pad 137c.

The connection terminals T11 are utilized as back-surface lands (PGA pads and BGA pads) for connecting the wiring substrate 100 to a motherboard or the like; are formed in an outer peripheral region; i.e., a region excluding a substantially central region, of the wiring substrate 100; and are disposed in such a rectangular array as to surround the substantially central region. Also, at least a portion of the surface of each of the connection terminals T11 is covered with the metal plating layer M.

The solder resist layer 14 is formed by laminating a solder resist film on the surface of the build-up layer 13. The solder resist layer 14 has openings 14a for partially exposing the surfaces of the connection terminals T11. Thus, the connection terminals T11 are in such a state that their surfaces are partially exposed from the solder resist layer 14 through the respective openings 14a. That is, the openings 14a of the solder resist layer 14 are of the SMD type such that the surfaces of the connection terminals T11 are exposed partially. In contrast to the openings 5a of the solder resist layer 5, the openings 14a of the solder resist layer 14 are formed individually for the connection terminals T11.

Solder balls B are formed from solder which contains substantially no lead, such as Sn—Ag, Sn—Cu, Sn—Ag—Cu, or Sn—Sb, in the respective openings 14a in such a manner as to be electrically connected to the respective connection terminals T11 via the metal plating layer M. In mounting the wiring substrate 100 on a motherboard or the like, the solder balls B of the wiring substrate 100 are reflowed, thereby electrically connecting the connection terminals T11 to corresponding connection terminals of the motherboard or the like.

(Method of Manufacturing a Wiring Substrate)

FIGS. 4 to 11 show processes in manufacturing the wiring substrate 100 according to the first embodiment. A method of manufacturing the wiring substrate 100 will next be described with reference to FIGS. 4 to 11.

Figure 4:
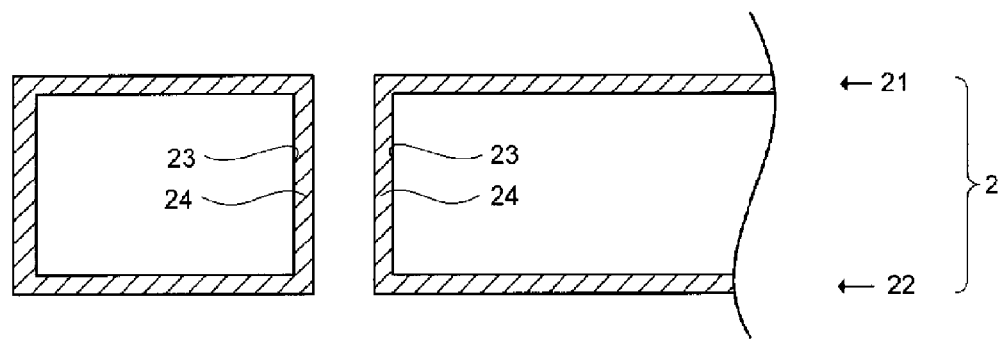
FIG. 4 A pair of views showing a process in manufacturing the wiring substrate according to the first embodiment (core substrate process).
Figure 4:
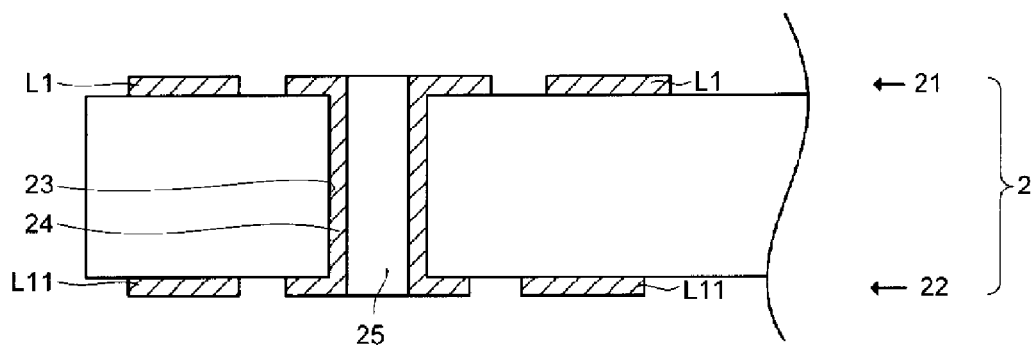

(Core Substrate Process: FIG. 4)

There is prepared a copper clad laminate configured such that a platelike resin substrate has copper foils affixed to its front and back surfaces, respectively. Through-holes which are to become the through-holes 23 are drilled in the copper clad laminate at predetermined positions. Then, the copper clad laminate is subjected to electroless copper plating and copper electroplating, thereby forming the through-hole conductors 24 on the inner walls of the through-holes 23, and copper plating layers on the opposite sides of the copper clad laminate (see FIG. 4(a)).

Subsequently, the through-hole conductors 24 are filled with the resin filler 25, such as epoxy resin. Furthermore, copper platings formed on the respective copper foils on the opposite sides of the copper clad laminate are etched to desired patterns so as to form the core conductive-layers 21 and 22, which form the respective metal wirings L1 and L11, on the front and back surfaces, respectively, of the copper clad laminate, thereby yielding the core substrate 2 (see FIG. 4(b)). Desirably, after the step of forming the through-holes 23, a desmearing process is performed for eliminating smear from processed portions.

Figure 5:
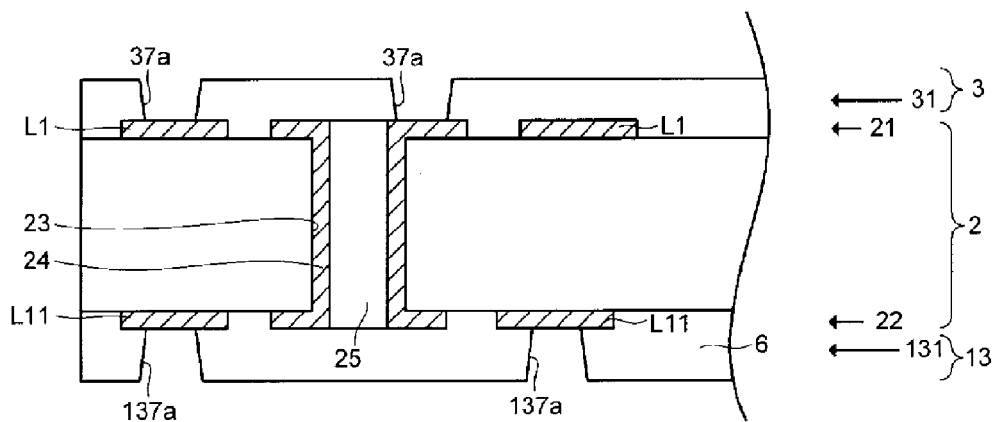
FIG. 5 A pair of views showing a process in manufacturing the wiring substrate according to the first embodiment (build-up process).
Figure 5:
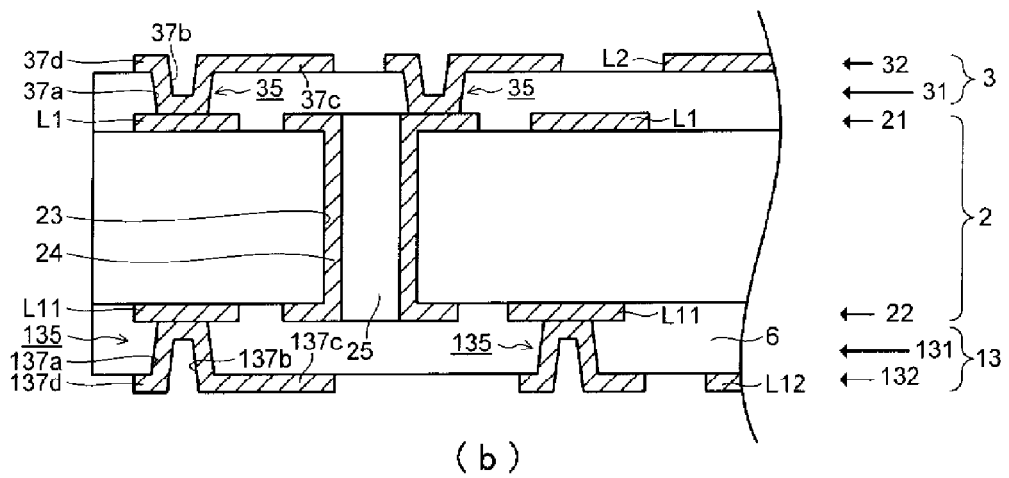
Figure 6:
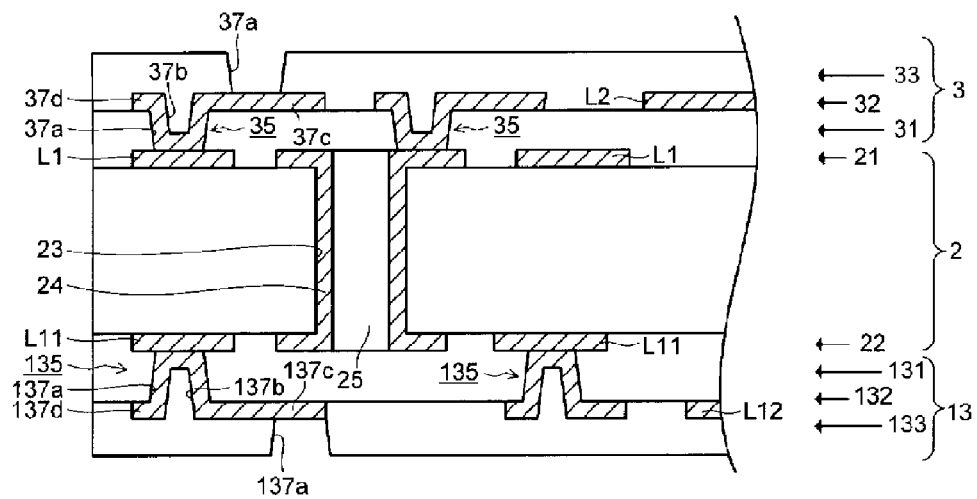
FIG. 6 A pair of views showing a process in manufacturing the wiring substrate according to the first embodiment (build-up process).
Figure 6:
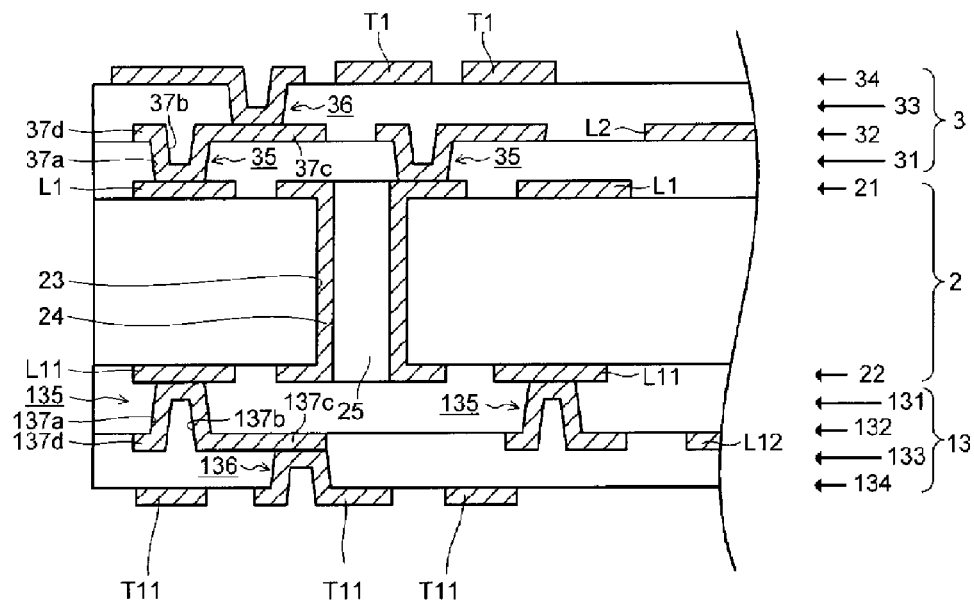

(Build-Up Process: FIGS. 5 and 6)

Insulating resin films which contain an epoxy resin as a main component and are to become the resin insulation layers 31 and 131 are overlaied on the front and back surfaces, respectively, of the core substrate 2. The resultant laminate is subjected to pressure and heat by use of a vacuum thermocompression press, thereby pressure bonding the insulating resin films to the core substrate 2 while the insulating resin films are heat-cured. Next, the via holes 37a and 137a are formed in the resin insulation layers 31 and 131, respectively, through laser irradiation by use of a conventionally known laser machining apparatus (see FIG. 5(a)).

Then, after the surfaces of the resin insulation layers 31 and 131 are roughened, electroless copper plating is performed, thereby forming electroless copper plating layers on the resin insulation layers 31 and 131, respectively, and on the inner walls of the via holes 37a and 137a. Next, photoresist is laminated on the electroless copper plating layers formed respectively on the resin insulation layers 31 and 131, followed by exposure and development to form plating resists in desired patterns.

Subsequently, with the plating resists being used as masks, copper electroplating is performed, thereby yielding copper platings in desired patterns. Next, the plating resists are removed, and then the electroless copper plating layers which underlie the plating resists are removed, thereby forming the conductive layers 32 and 132, which form the respective metal wirings L2 and L12. At this time, the vias 35 and 135 composed of the via conductors 37b and 137b, the via pads 37c and 137c, and the via lands 37d and 137d, respectively, are also formed (see FIG. 5(b)).

Next, insulating resin films which contain an epoxy resin as a main component and are to become the resin insulation layers 33 and 133 are overlaied on the conductive layers 32 and 132, respectively. The resultant laminate is subjected to pressure and heat by use of a vacuum thermocompression press, thereby pressure bonding the insulating resin films to the conductive layers 32 and 132 while the insulating resin films are heat-cured. Next, the via holes 37a and 137a are formed in the resin insulation layers 33 and 133, respectively, through laser irradiation by use of a conventionally known laser machining apparatus (see FIG. 6(a)).

Then, in a manner similar to that for forming the conductive layers 32 and 132, the conductive layers 34 and 134 having the connection terminals T1 and T11, respectively, and the vias 36 and 136 are formed respectively on the resin insulation layers 33 and 133 in which the via holes 37a and 137a are formed respectively (see FIG. 6(b)).

Figure 7:
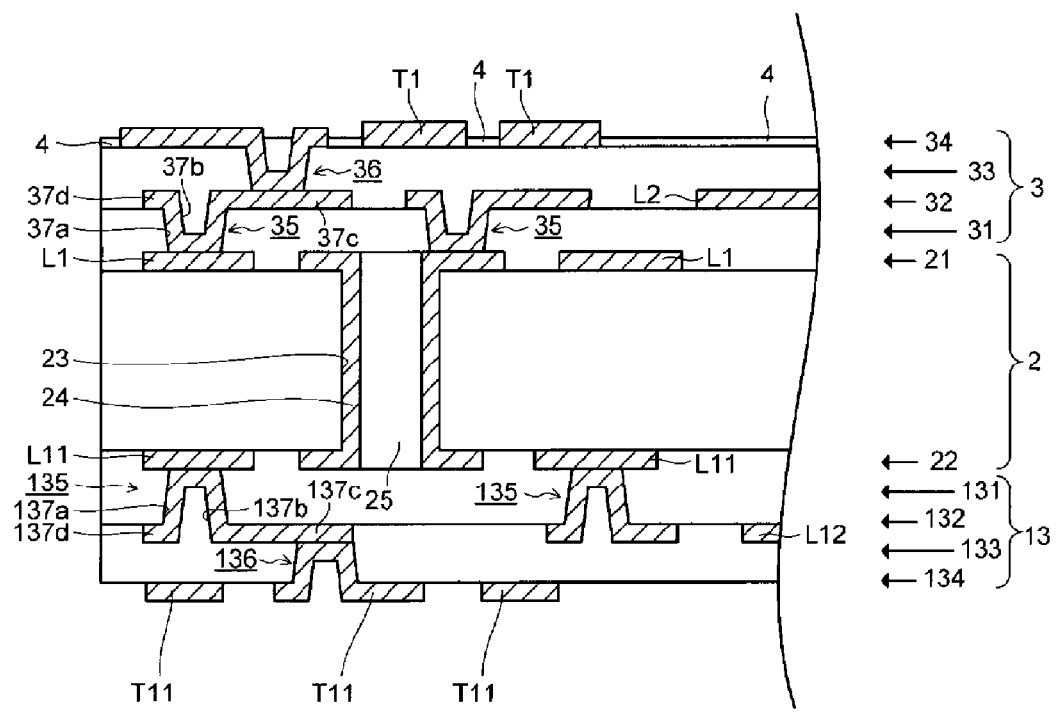
FIG. 7 View showing a process in manufacturing the wiring substrate according to the first embodiment (filling process).

(Filling Process: FIG. 7)

Next, the filling member 4 is provided in a filling manner between the connection terminals T1, which form a surface layer of the build-up layer 3, up to a level lower than the connection terminals T1. In order to provide the filling member 4 in a filling manner between the connection terminals T1, preferably, the surfaces (particularly, side surfaces) of the connection terminals T1 are roughened. The surfaces of the connection terminals T1 can be roughened, for example, by treatment with an etchant, such as MEC ETCH BOND (a product of MEC Co. Ltd.). Instead of roughening the surfaces of the connection terminals T1, the following process may be employed for improving adhesion to the filling member 4: after the connection terminals T1 are coated at their surfaces with any one metal element selected from among Sn (tin), Ti (titanium), Cr (chromium), and Ni (nickel) to thereby form a metal layer, the metal layer surface is treated with a coupling agent.

Various methods are available for providing the filling member 4 in a filling manner between the connection terminals T1. Methods of providing the filling member 4 in a filling manner between the connection terminals T1 will next be described. In the following first to fourth filling methods, an insulating resin which is to become the filling member 4 can be coated by various methods, such as printing, laminating, roll coating, and spin coating.

(First Filling Method)

According to the first filling method, after a thermosetting, insulating resin is thinly coated on the surface of the build-up layer 3 having the connection terminals T1 formed at a surface layer and is then heat-cured, the cured insulating resin is ground until it becomes lower in level than the connection terminals T1, thereby providing the filling member 4 in a filling manner between the connection terminals T1.

(Second Filling Method)

According to the second filling method, after a thermosetting, insulating resin is thinly coated on the surface of the build-up layer 3 having the connection terminals T1 formed at a surface layer, excess insulating resin which covers the upper surfaces of the connection terminals T1 is removed by means of a solvent which dissolves the insulating resin; then, heat-curing is performed, thereby providing the filling member 4 in a filling manner between the connection terminals T1.

(Third Filling Method)

According to the third filling method, after a thermosetting, insulating resin is thickly coated on the surface of the build-up layer 3 having the connection terminals T1 formed at a surface layer and is then heat-cured, a region other than a semiconductor device mounting region is masked, the cured insulating resin is dry-etched by RIE (Reactive Ion Etching) or the like until it becomes lower in level than the connection terminals T1, thereby providing the filling member 4 in a filling manner between the connection terminals T1. In the case of using the third filling method for providing the filling member 4 in a filling manner between the connection terminals T1, the filling member 4 and the solder resist layer 5 are integrally formed.

(Fourth Filling Method)

Figure 8:
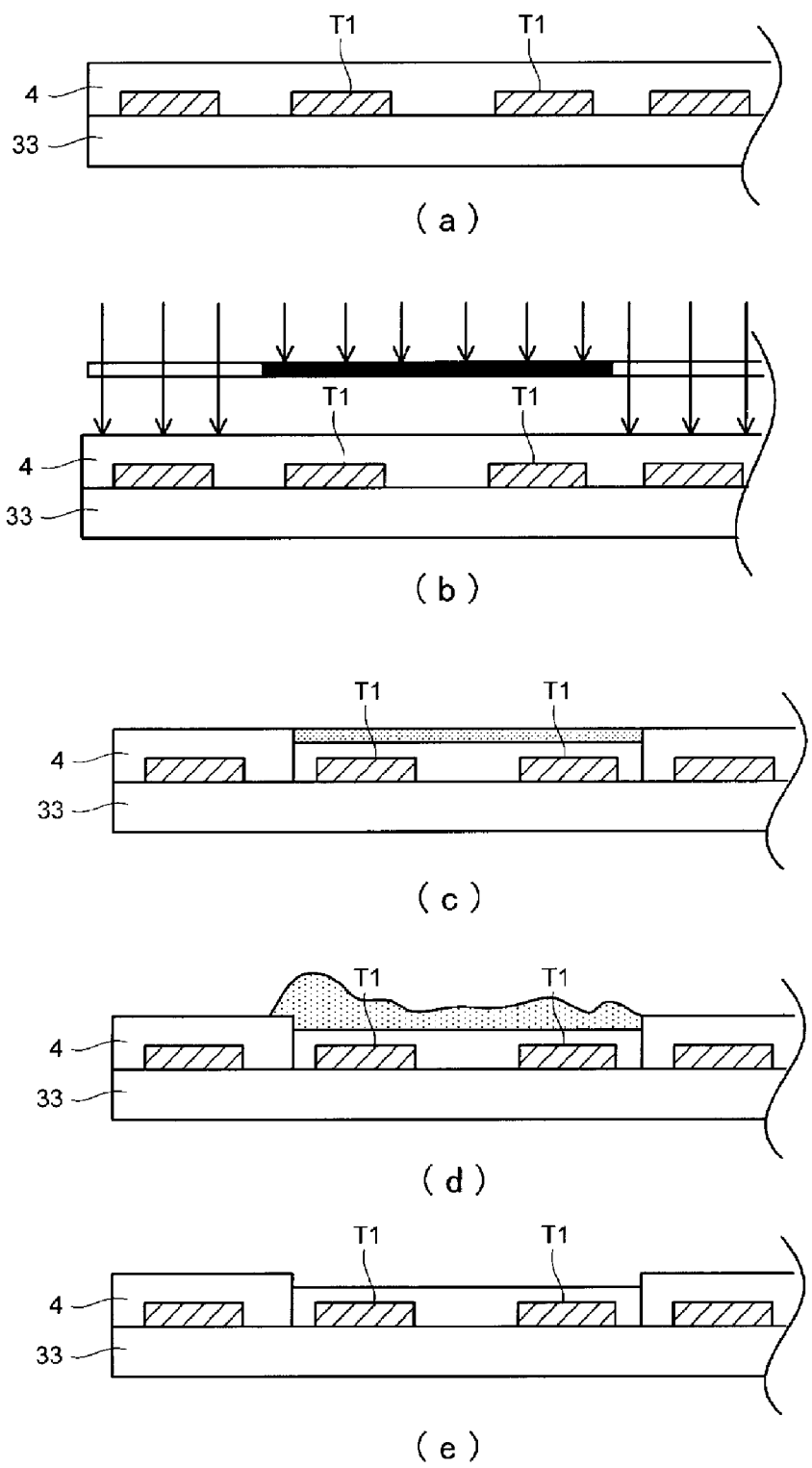
FIG. 8 A set of explanatory views of a fourth filling method.

FIG. 8 is a set of explanatory views for explaining the fourth filling method. The fourth filling method is described below with reference to FIG. 8. According to the fourth filling method, after a photocurable, insulating resin is thickly coated on the surface of the build-up layer 3 having the connection terminals T1 formed at a surface layer (see FIG. 8(*a*)), the coated insulating resin is subjected to exposure and development while regions which are to become the openings 5*a* of the solder resist layer are masked, thereby photo-curing the coated insulating resin in a region which is to become the outer region around the openings 5*a* (see FIG. 8(*b*)). Next, the intermediate product of the wiring substrate 100 is immersed in an aqueous solution of sodium carbonate (concentration 1 wt. %) for a short period of time (to such an extent that the surface of the insulating resin in an unexposed region slightly swells) (see FIG. 8(*c*)). Subsequently, the swelled insulating resin is emulsified by washing in water (FIG. 8(*d*)). Next, the swelled, emulsified insulating resin is removed from the intermediate product of the wiring substrate 100 (see FIG. 8(*e*)). The above-mentioned immersion and washing in water are repeated once or a plurality of times until the insulating resin which is not photo-cured becomes lower in level than the connection terminals T1. Subsequently, the insulating resin is cured by means of heat or ultraviolet rays. In the case of using the fourth filling method for providing the filling member 4 in a filling manner between the connection terminals T1, the filling member 4 and the solder resist layer 5 are integrally formed.

Figure 9:
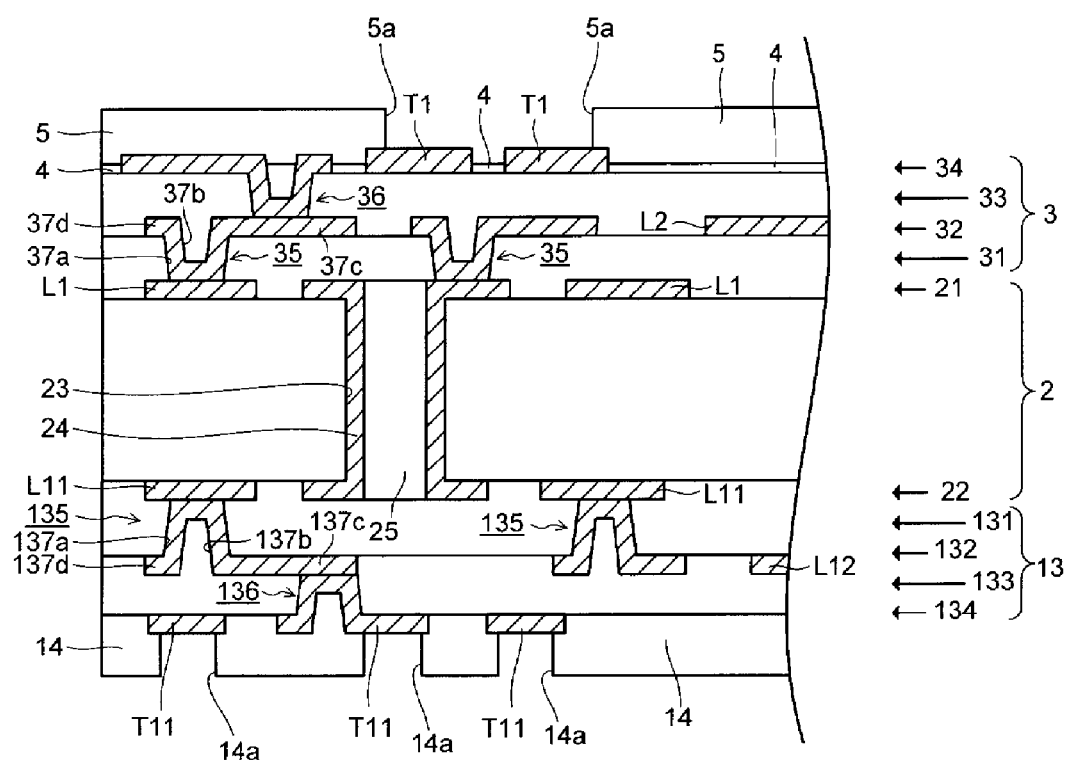
FIG. 9 View showing a process in manufacturing the wiring substrate according to the first embodiment (solder resist layer process).

(Solder Resist Layer Process: FIG. 9)

Solder resist films are press-laminated respectively on the filling member 4 and the build-up layer 13. The laminated solder resist films are subjected to exposure and development, thereby forming the solder resist layer 5 having the NSMD-type openings 5*a* for exposing the end surfaces and side surfaces of the connection terminals T1, and the solder resist layer 14 having the SMD-type openings 14*a* for partially exposing the surfaces of the connection terminals T11. In the case of employment of the above-mentioned third or fourth filling method in the filling process, the filling member 4 and the solder resist layer 5 are integrally formed; thus, the solder resist layer process does not require a step of laminating the solder resist layer 5.

Figure 10:
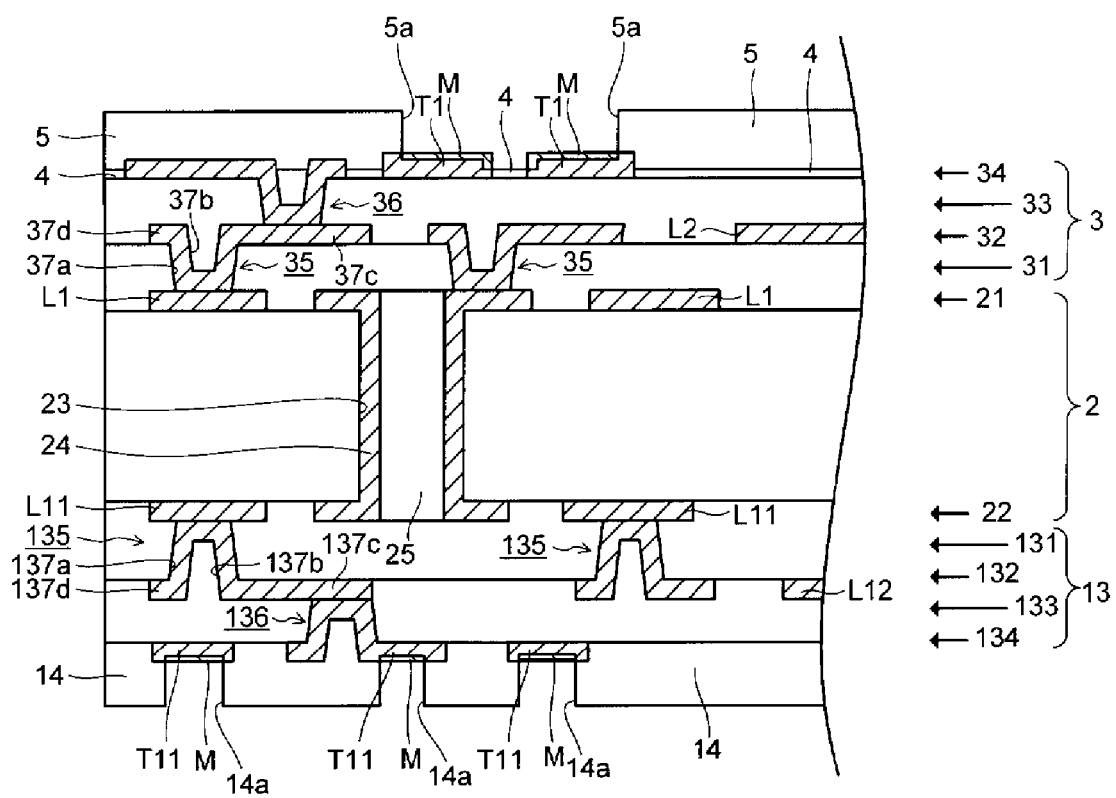
FIG. 10 View showing a process in manufacturing the wiring substrate according to the first embodiment (plating process).

(Plating Process: FIG. 10)

Next, the exposed surfaces of the connection terminals T1 are subjected to etching by sodium persulfate or the like to remove impurities, such as an oxide film, from the surfaces of the connection terminals T1 and to form the step L at the periphery of the main surface F of each of the connection terminals T1. Subsequently, the metal plating layer M is formed on the exposed surfaces of the connection terminals T1 and T11 by electroless reduction plating which uses a reducing agent. In the case of forming the metal plating layer M on the exposed surfaces of the connection terminals T1 by electroless displacement plating, the metal plating layer M is formed through displacement of metal of the exposed surfaces of the connection terminals T1. Thus, without need to etch the exposed surfaces of the connection terminals T1 by sodium persulfate or the like, the step L is formed at the periphery of the main surface F of each of the connection terminals T1.

In coating solder on the exposed surfaces of the connection terminals T1, the following two methods are available according to the thickness of a solder layer to be formed by coating.

(First Coating Method)

In the case of coating a solder layer having a thickness of 5 µm to 30 µm on the exposed surfaces of the connection terminals T1, the exposed surfaces of the connection terminals T1 are slightly etched (soft etching) so as to remove an oxide film from the exposed surfaces of the connection terminals T1. At this time, the step L is formed at the periphery of the main surface F of each of the connection terminals T1. Next, a paste of mixture of an Sn (tin) powder, an ionic compound containing metal, such as Ag (silver) and Cu (copper), and flux (e.g., SUPER SOLDER (product name) from Harima Chemicals, Inc.) is thinly applied to the entire inner regions of the SMD-type openings 5*a* in such a manner as to cover the entire exposed surfaces of the connection terminals T1. Subsequently, reflowing is performed, thereby forming a solder layer of an alloy of Sn and Ag or an alloy of Sn, Ag, and Cu on the exposed surfaces of the connection terminals T1.

(Second Coating Method)

In the case of coating a solder layer having a thickness of 10 µm or less on the exposed surfaces of the connection terminals T1, the exposed surfaces of the connection terminals T1 are slightly etched (soft etching) so as to remove an oxide film from the exposed surfaces of the connection terminals T1. At this time, the step L is formed at the periphery of the main surface F of each of the connection terminals T1. Next, electroless Sn (tin) plating is performed on the exposed surfaces of the connection terminals T1 to form an Sn plating layer, and flux is applied in such a manner as to cover the entire surface of the Sn plating layer. Subsequently, reflowing is performed to melt the Sn plating layer formed on the connection terminals T1, thereby forming a solder layer on the main surfaces F of the connection terminals T1. At this time, molten Sn coheres on the main surfaces F of the connection terminals T1 by the effect of surface tension.

Figure 11:
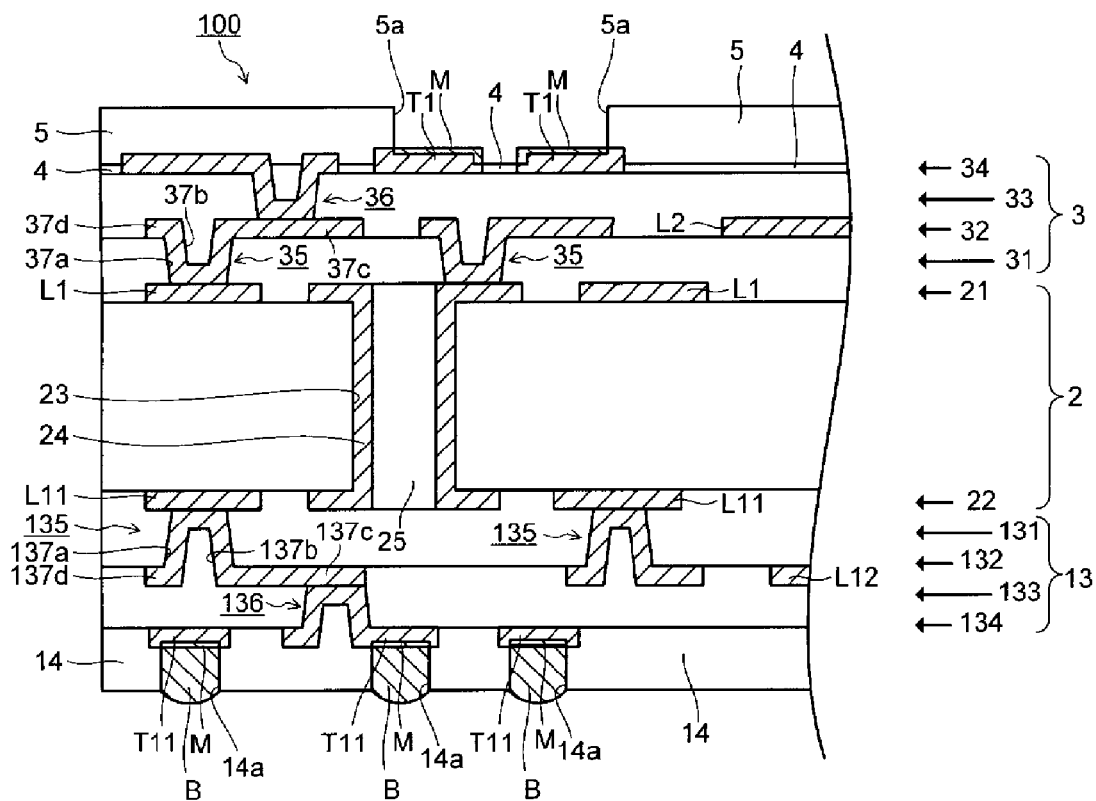
FIG. 11 View showing a process in manufacturing the wiring substrate according to the first embodiment (back end process).

(Back End Process: FIG. 11)

Solder paste is applied, by solder printing, to the metal plating layer M formed on the connection terminals T11; subsequently, the applied solder paste is reflowed at a predetermined temperature for a predetermined time, thereby forming the solder balls B on the connection terminals T11.

As described above, since the wiring substrate 100 according to the first embodiment is configured such that the filling member 4 is provided in a filling manner between the connection terminals T1, there can be prevented the generation of voids in an underfill, an NCP, or an NCF in regions between the connection terminals T1. Therefore, there can be prevented the occurrence of a short circuit between the connection terminals which could otherwise result from flow of solder into the voids during reflow. Also, since the connection terminals T1 are reduced in the area of exposure, solder coated on the individual connection terminals does not increase in diameter, whereby the connection terminals T1 can be disposed at a fine pitch. Additionally, in forming the metal plating layer M on the surfaces of the connection terminals T1, there can be prevented plating sag between the connection terminals T1, and undercut in which bottom portions of the connection terminals T1 are etched. Furthermore, since each of the connection terminals T1 has the step L formed at the outer periphery of the first main surface F opposite the contact surface in contact with the resin insulation layer 33 of the build-up layer 3, solder coated on the individual connection terminals T1 does not increase in diameter, whereby the connection terminals T1 can be disposed at a finer pitch.

Also, since, after the connection terminals T1 are roughened at their contact surfaces which come into contact with the filling member 4, the filling process is performed for providing the filling member 4 in a filling manner between the connection terminals T1, bonding strength between the connection terminals T1 and the filling member 4 is enhanced. Thus, there can be restrained potential separation of the connection terminals T1 in the course of manufacture. By means of the same material being used to form the filling member 4 and the solder resist layer 5, the filling member 4 has substantially similar solder repellency as the solder resist layer 5, whereby there can be restrained the occurrence of a short circuit between the connection terminals T1 which could otherwise result from solder remaining on the filling member 4.

Furthermore, the filling member 4 provided in a filling manner between the connection terminals T1 has the thickness D1 smaller than the thickness (height) D2 of the connection terminals T1. That is, the connection terminals T1 slightly project from the upper surface of the filling member 4. Thus, even when the centers of connection terminals of a semiconductor chip deviate from the centers of the connection terminals T1, the connection terminals of the semiconductor chip come into contact with ends of the corresponding connection terminals T1; therefore, there is improved the reliability of connection between the connection terminals T1 and the connection terminals of the semiconductor chip.

Second Embodiment

Figure 12:
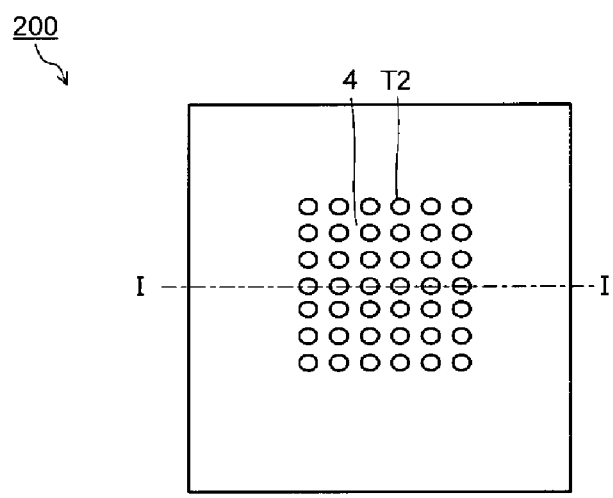
FIG. 12 Plan view (front side) of a wiring substrate according to a second embodiment.
Figure 13:
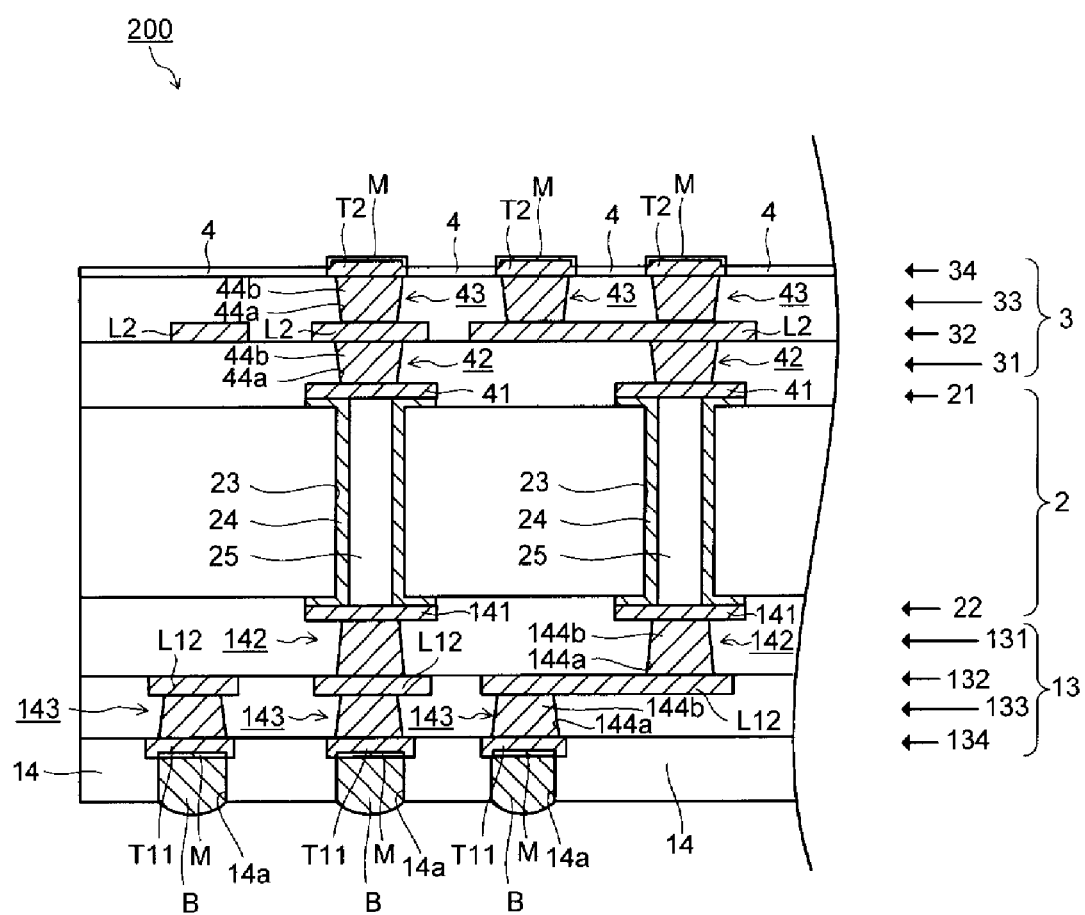
FIG. 13 Fragmentary, sectional view of the wiring substrate according to the second embodiment.
Figure 14:
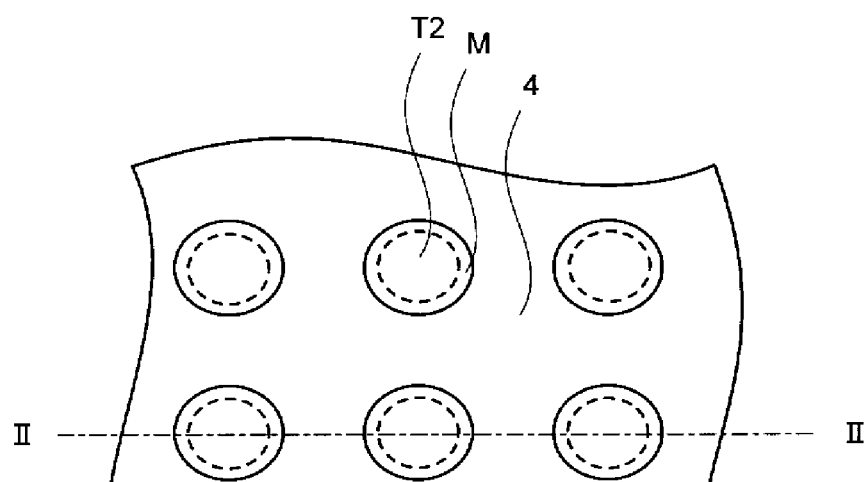
FIG. 14 A pair of configurational views of connection terminals on the front side of the wiring substrate according to the second embodiment.
Figure 14:
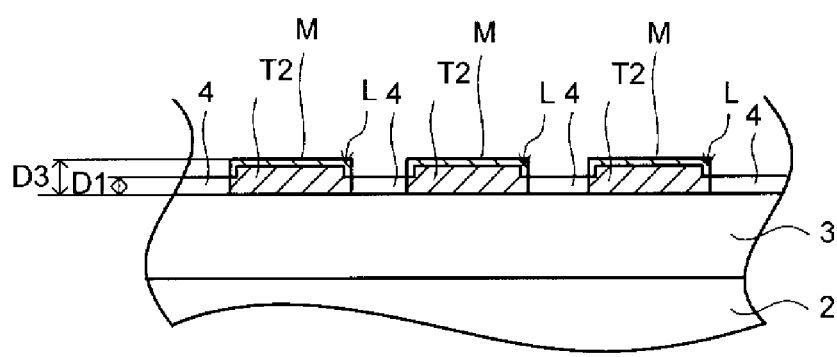

FIG. 12 is a plan view (front side) of a wiring substrate 200 according to a second embodiment. FIG. 13 is a fragmentary, sectional view of the wiring substrate 200 taken along line I-I of FIG. 12. FIG. 14 is a pair of configurational views of connection terminals T2 formed on the front side of the wiring substrate 200. FIG. 14(a) is a top view of the connection terminals T2. FIG. 14(b) is a sectional view taken along line II-II of FIG. 14(a). The configuration of the wiring substrate 200 will next be described with reference to FIGS. 12 to 14; however, configurational features similar to those of the wiring substrate 100 described above with reference to FIGS. 1 to 3 are denoted by like reference numerals, and repeated description thereof is omitted.

(Configuration on the Front Side)

On the front side of the wiring substrate 200, a cover plating layer 41 electrically connected to the core conductive-layer 21 is formed, and the cover plating layer 41 and the conductive layer 32 are electrically connected through filled vias 42, whereas the conductive layer 32 and the conductive layer 34 are electrically connected through filled vias 43. Each of the filled vias 42 and 43 has a via hole 44a and a via conductor 44b, which fills the via hole 44a through application by plating. Also, only connection terminals T2, which will be described later, are formed at the front surface of the build-up layer 3 such that there are not formed a wiring pattern connected at the same layer to the connection terminals T2, and a solder resist layer which covers the wiring pattern. The resin insulation layers 31 and 33 and the conductive layer 32 constitute a laminate.

The connection terminals T2 formed on the front side of the wiring substrate 200 are of a so-called area bump type and are disposed over the entire mounting region for a semiconductor chip. The connection terminals T2 are connected to the semiconductor chip. The semiconductor chip is electrically connected to the connection terminals T2, thereby being mounted on the wiring substrate 200. In order to improve adhesion to the filling member 4, the connection terminals T2 are roughened at their surfaces. The surfaces of the connection terminals T2 can be roughened, for example, by treatment with an etchant, such as MEC ETCH BOND (a product of MEC Co. Ltd.).

Each of the connection terminals T2 has the step L formed at the outer periphery of the first main surface F opposite the contact surface in contact with the resin insulation layer 33 of the build-up layer 3, and the exposed surface of the connection terminal T2 including the step L is covered with the metal plating layer M. In mounting a semiconductor chip on the wiring substrate 200, solder coated on the connection terminals of the semiconductor chip is reflowed, thereby electrically connecting the connection terminals of the semiconductor chip and the corresponding connection terminals T2. In place of use of the metal plating layer M, coating with solder may be employed, or an anticorrosive OSP treatment may be applied.

The metal plating layer M is formed on the connection terminals T2 as follows: the exposed surfaces of the connection terminals T2 are subjected to etching by sodium persulfate or the like to thereby form the step L at the periphery of the main surface F of each of the connection terminals T2; subsequently, the metal plating layer M is formed on the exposed surfaces of the connection terminals T2 by electroless reduction plating which uses a reducing agent. In the case of forming the metal plating layer M on the exposed surfaces of the connection terminals T2 by electroless displacement plating, the metal plating layer M is formed through displacement of metal of the exposed surfaces of the connection terminals T2. Thus, without need to etch the exposed surfaces of the connection terminals T2 by sodium persulfate or the like, the step L is formed at the periphery of the main surface F of each of the connection terminals T2.

Also, a plurality of the connection terminals T2 of the wiring substrate 200 project from the resin insulation layer 33, whereby the end surfaces and side surfaces of the connection terminals T2 are exposed. Thus, similar to the case of the connection terminals T1 of the wiring substrate 100, the filling member 4 is provided in a filling manner between the connection terminals T2. Furthermore, the filling member 4 is provided in a filling manner between the connection terminals T2 in a state of adhesion to the side surfaces of the connection terminals T2 formed at a surface layer of the build-up layer 3, and the thickness D1 of the filling member 4 is smaller than the thickness (height) D3 of the connection terminals T2. The filling member 4 can be provided in a filling manner between the connection terminals T2 by any one of the first to fourth filling methods described above in the section of the first embodiment.

(Configuration on the Back Side)

On the back side of the wiring substrate 200, a cover plating layer 141 electrically connected to the core conductive-layer 22 is formed, and the cover plating layer 141 and the conductive layer 132 are electrically connected through filled vias 142, whereas the conductive layer 132 and the conductive layer 134 are electrically connected through filled vias 143. Each of the filled vias 142 and 143 has a via hole 144a and a via conductor 144b, which fills the via hole 144a through application by plating.

As described above, the wiring substrate 200 according to the second embodiment is configured such that the filling member 4 is provided in a filling manner between the connection terminals T2. Also, each of the connection terminals T2 has the step L formed at the outer periphery of the first main surface F opposite the contact surface in contact with the resin insulation layer 33 of the build-up layer 3. Also, the filling member 4 is in contact with the side surfaces of the connection terminals T2. The connection terminals T2 are roughened at their contact surfaces which come into contact with the filling member 4. Furthermore, the filling member 4 provided in a filling manner between the connection terminals T2 has the thickness D1 smaller than the thickness (height) D3 of the connection terminals T2. Thus, the wiring substrate 200 yields effects similar to those yielded by the wiring substrate 100 according to the first embodiment.

Third Embodiment

Figure 15:
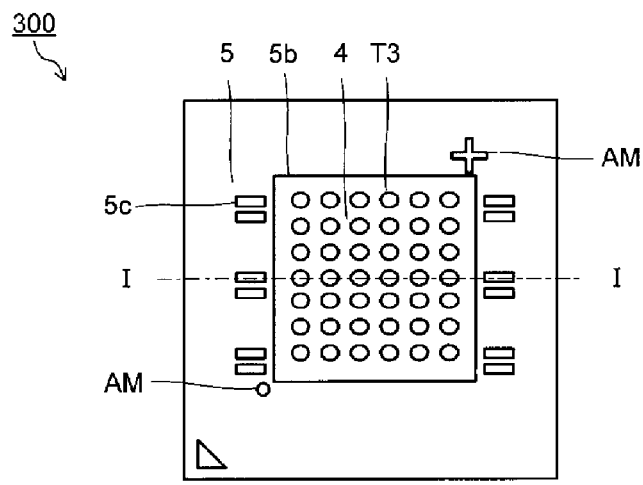
FIG. 15 Plan view (front side) of a wiring substrate according to a third embodiment.
Figure 16:
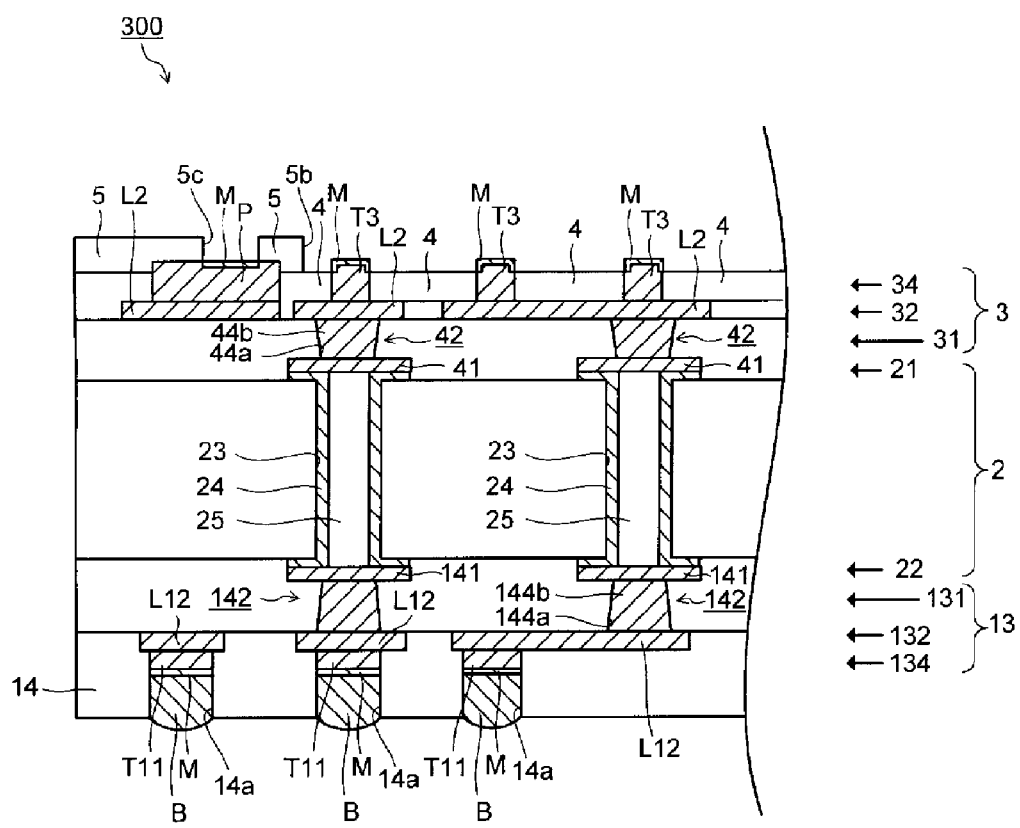
FIG. 16 Fragmentary, sectional view of the wiring substrate according to the third embodiment.
Figure 17:
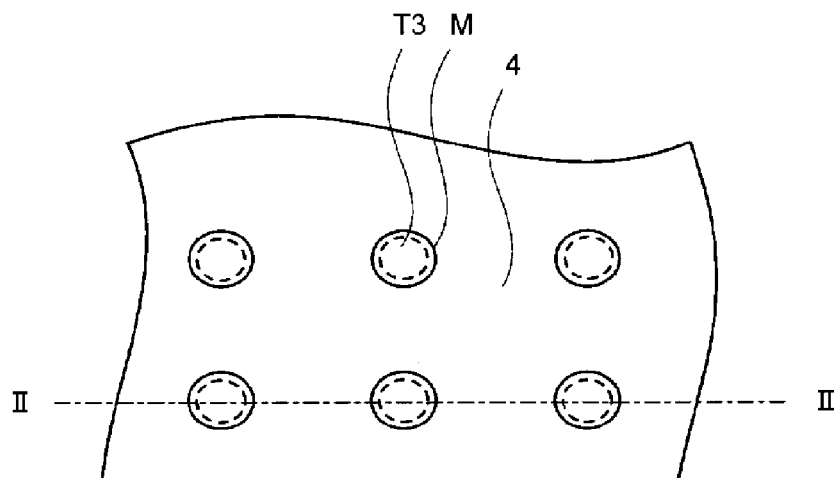
FIG. 17 A pair of configurational views of connection terminals on the front side of the wiring substrate according to the third embodiment.
Figure 17:
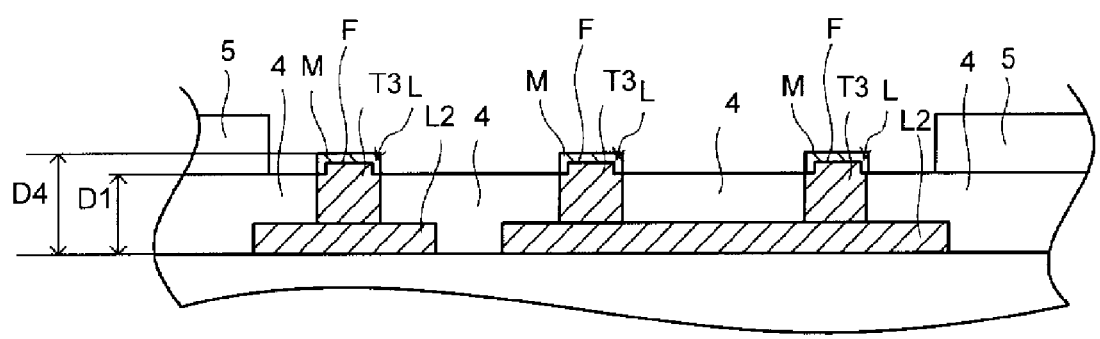

FIG. 15 is a plan view (front side) of a wiring substrate 300 according to a third embodiment. FIG. 16 is a fragmentary, sectional view of the wiring substrate 300 taken along line I-I of FIG. 15. FIG. 17 is a pair of configurational views of connection terminals T3 formed on the front side of the wiring substrate 300. FIG. 17(a) is a top view of the connection terminals T3. FIG. 17(b) is a sectional view taken along line II-II of FIG. 17(a).

The wiring substrate 300 according to the third embodiment differ from the wiring substrate 200 described above with reference to FIGS. 12 to 14 in that the connection terminals T3 and T11 are formed directly on the conductive layers 32 and 132, respectively, without involvement of vias. The configuration of the wiring substrate 300 will next be described with reference to FIGS. 15 to 17; however, configurational features similar to those of the wiring substrate 100 described above with reference to FIGS. 1 to 3 and the wiring substrate 200 described above with reference to FIGS. 12 to 14 are denoted by like reference numerals, and repeated description thereof is omitted.

(Configuration on the Front Side)

On the front side of the wiring substrate 300, the cover plating layer 41 electrically connected to the core conductive-layer 21 is formed, and the cover plating layer 41 and the conductive layer 32 are electrically connected through the filled vias 42. Each of the filled vias 42 has the via hole 44a and the via conductor 44b, which fills the via hole 44a through application by plating.

The connection terminals T3 formed on the conductive layer 32 of the wiring substrate 300 are disposed at substantially even intervals in a lattice array over the entire mounting region for a semiconductor chip. The connection terminals T3 have a columnar shape (e.g., circular column, square column, or triangular column) and are formed directly on the conductive layer 32 without involvement of vias such that their upper portions project from the surface of the filling member 4. The connection terminals T3 are connected to the semiconductor chip. The semiconductor chip is electrically connected to the connection terminals T3, thereby being mounted on the wiring substrate 300. In order to improve adhesion to the filling member 4, the connection terminals T3 are roughened at their surfaces. The surfaces of the connection terminals T3 can be roughened, for example, by treatment with an etchant, such as MEC ETCH BOND (a product of MEC Co. Ltd.).

Instead of roughening the surfaces of the connection terminals T3, the following process may be employed for improving adhesion to the filling member 4: after the connection terminals T3 are coated at their surfaces with any one metal element selected from among Sn (tin), Ti (titanium), Cr (chromium), and Ni (nickel) to thereby form a metal layer, the metal layer surface is treated with a coupling agent.

Furthermore, each of the connection terminals T3 has the step L formed at the outer periphery of the first main surface F, and the exposed surface of the connection terminal T3 including the step L is covered with the metal plating layer M. In mounting the semiconductor chip on the wiring substrate 300, solder coated on the connection terminals of the semiconductor chip is reflowed, thereby electrically connecting the connection terminals of the semiconductor chip and the corresponding connection terminals T3. The metal plating layer M is composed of, for example, a single metal layer or a plurality of metal layers selected from among an Ni layer, an Sn layer, an Ag layer, a Pd layer, an Au layer, etc. (e.g., Ni layer/Au layer or Ni layer/Pd layer/Au layer).

Also, in place of use of the metal plating layer M, an anticorrosive OSP (Organic Solderability Preservative) treatment may be applied. Also, solder may be coated on the exposed surfaces of the connection terminals T3 including the steps L; furthermore, after the exposed surfaces of the connection terminals T3 including the steps L are covered with the metal plating layer M, the metal plating layer M may be coated with solder. Since a method of coating solder on the exposed surfaces of the connection terminals T3 has been described in the section of the first embodiment, repeated description thereof is omitted.

The filling member 4 is provided in a filling manner between the connection terminals T3 in a state of adhesion to the side surfaces of the connection terminals T3 formed at a surface layer of the build-up layer 3. The thickness D1 of the filling member 4 is smaller than the thickness (height) D4 of the connection terminals T3. The filling member 4 can be provided in a filling manner between the connection terminals T3 by any one of the first to fourth filling methods described above in the section of the first embodiment.

The solder resist layer 5 covers the front side of a wiring pattern connected to the connection terminals T3 and has an opening 5b from which are exposed the connection terminals T3 disposed at substantially even intervals in a mounting region for a semiconductor chip, and openings 5c from which chip capacitor mounting pads P are exposed respectively. The opening 5b of the solder resist layer 5 is of the NSMD type such that a plurality of the connection terminals T3 are disposed within the same opening. Also, alignment marks AM are formed on the solder resist layer 5.

(Configuration on the Back Side)

On the back side of the wiring substrate 300, the cover plating layer 141 electrically connected to the core conductive-layer 22 is formed, and the cover plating layer 141 and the conductive layer 132 are electrically connected through filled vias 142. Each of the filled vias 142 has the via hole 144a and the via conductor 144b, which fills the via hole 144a through application by plating. Also, the connection terminals T11 to be connected to a motherboard or the like (not shown) are formed directly on the conductive layer 132 without involvement of vias.

(Method of Manufacturing a Wiring Substrate)

Figure 18:
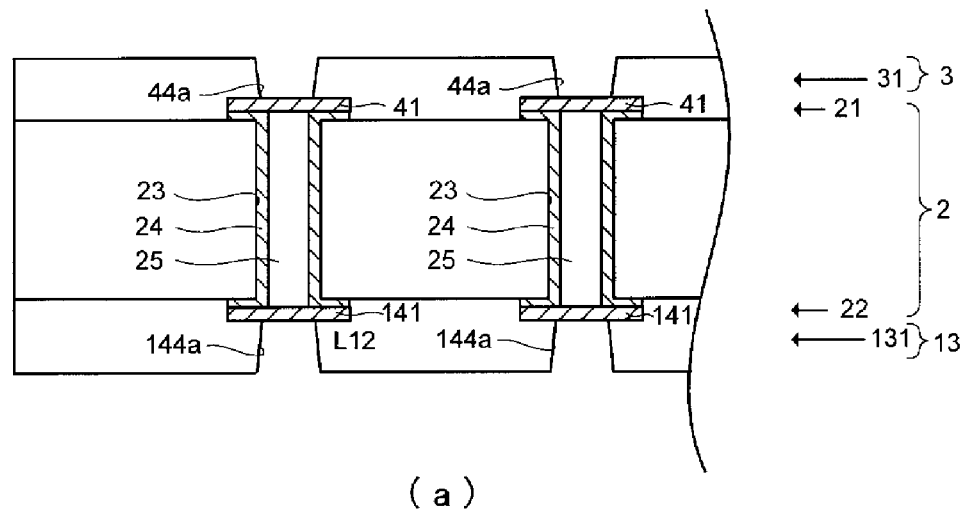
FIG. 18 A pair of views showing a process in manufacturing the wiring substrate according to the third embodiment (build-up process).
Figure 18:
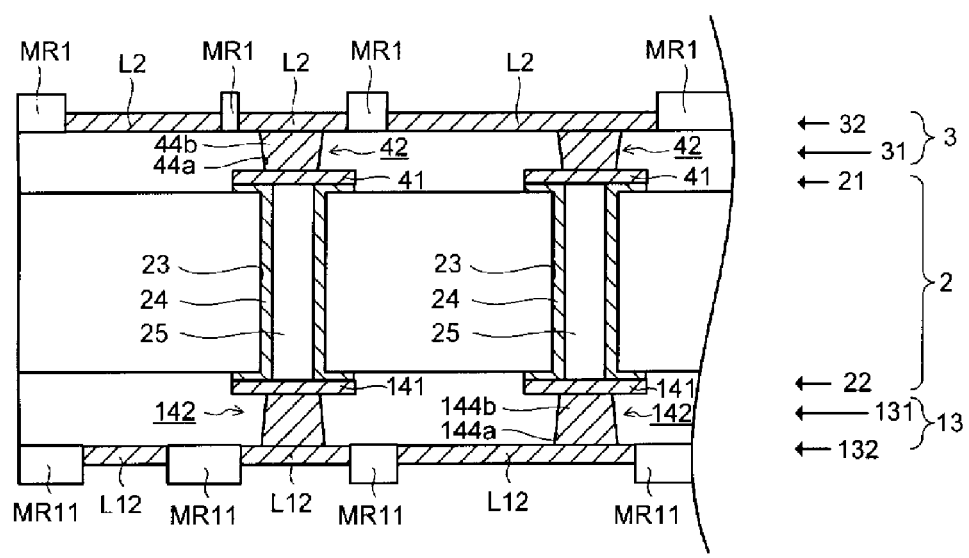
Figure 19:
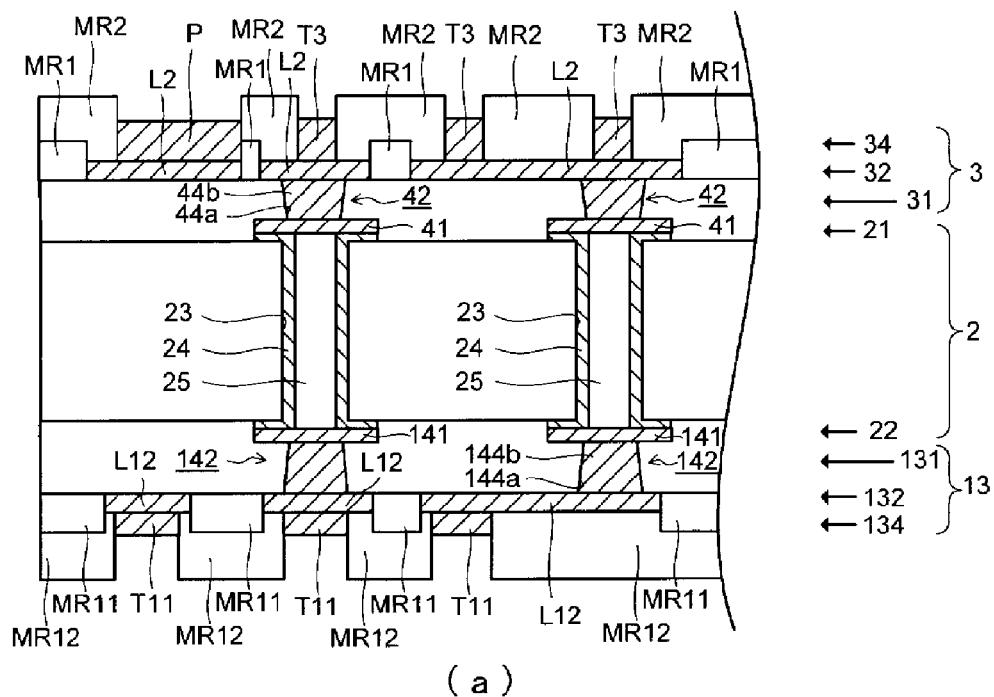
FIG. 19 A pair of views showing a process in manufacturing the wiring substrate according to the third embodiment (convex plating layer forming process).
Figure 19:
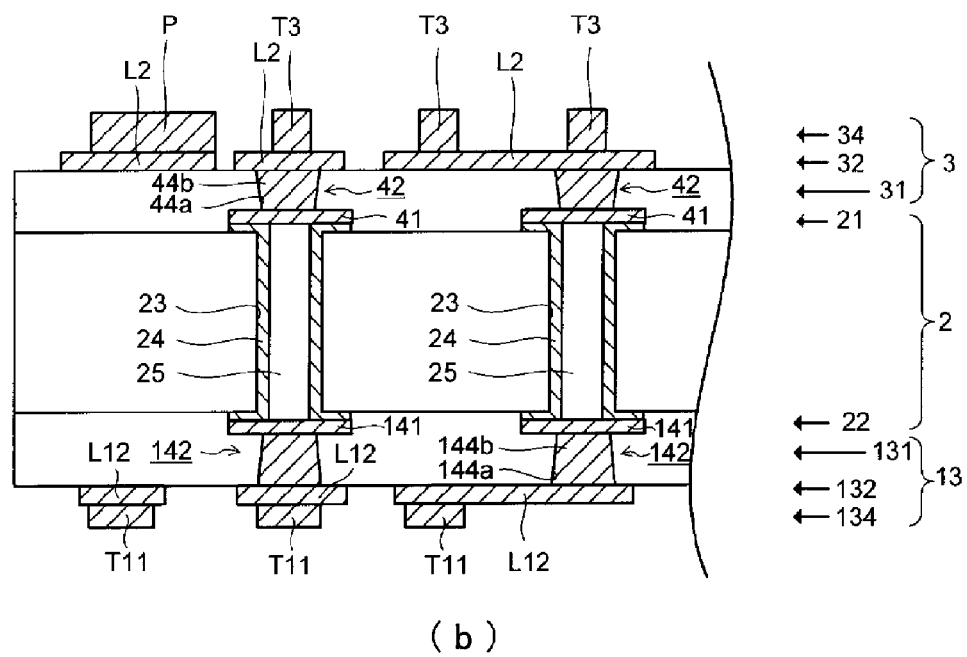

FIGS. 18 and 19 show processes in manufacturing the wiring substrate 300 according to the third embodiment. A method of manufacturing the wiring substrate 300 will next be described with reference to FIGS. 18 and 19. The core substrate process, the filling process, the solder resist layer process, the plating process, and the back end process are similar to those of the method of manufacturing the wiring substrate 100 according to the first embodiment described above with reference to FIGS. 4 and 7 to 11, and repeated description thereof is omitted.

(Build-Up Process: FIG. 18)

Insulating resin films which contain an epoxy resin as a main component and are to become the resin insulation layers 31 and 131 are overlaied on the front and back surfaces, respectively, of the core substrate 2. The resultant laminate is subjected to pressure and heat by use of a vacuum thermocompression press, thereby pressure bonding the insulating resin films to the core substrate 2 while the insulating resin films are heat-cured. Next, the via holes 44a and 144a are formed in the resin insulation layers 31 and 131, respectively, through laser irradiation by use of a conventionally known laser machining apparatus (see FIG. 18(a)).

Then, after the surfaces of the resin insulation layers 31 and 131 are roughened, electroless copper plating is performed, thereby forming electroless copper plating layers on the resin insulation layers 31 and 131, respectively, and on the inner walls of the via holes 44a and 144a. Next, photoresist is laminated on the electroless copper plating layers formed respectively on the resin insulation layers 31 and 131, followed by exposure and development to form plating resists MR1 and MR11 in desired patterns. Subsequently, with the plating resists MR1 and MR11 being used as masks, copper electroplating is performed, thereby yielding copper platings in desired patterns (see FIG. 18(b)).

(Convex Plating Layer Forming Process: FIG. 19)

Next, while the plating resists MR1 and MR11 are left intact, photoresist is laminated on the electroless copper plating layers formed respectively on the resin insulation layers 31 and 131, followed by exposure and development to form plating resists MR2 and MR12 in desired patterns. Subsequently, with the plating resists MR2 and MR12 being used as masks, copper electroplating is performed, thereby yielding copper platings in desired patterns (see FIG. 19(a)).

Next, the plating resists MR1, MR2, MR11, and MR12 are removed, and then the electroless copper plating layers which underlie the plating resists MR1, MR2, MR11, and MR12 are removed, thereby forming the conductive layer 34 having the connection terminals T3 and the pads P on the conductive layer 32, and the conductive layer 134 having the connection terminals T11 on the conductive layer 132 (see FIG. 19(b)).

As described above, the wiring substrate 300 according to the third embodiment is configured such that the connection terminals T3 and T11 are formed directly on the conductive layers 32 and 132, respectively, without involvement of vias. Thus, the number of processes in manufacturing the wiring substrate 300 can be reduced, thereby lowering manufacturing costs. Also, since the columnar connection terminals T3 project from the surface of the filling member 4, the connection terminals T3 can be disposed at high density within a mounting region for a semiconductor chip. Other effects which the wiring substrate 300 yield are similar to those yielded by the wiring substrate 100 according to the first embodiment and the wiring substrate 200 according to the second embodiment.

Fourth Embodiment

Figure 20:
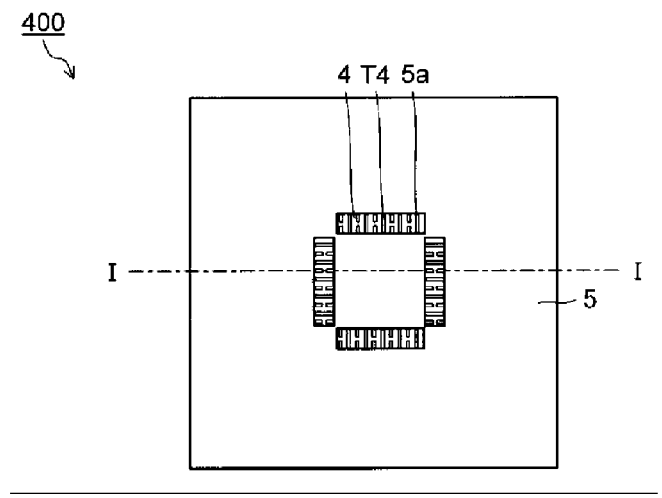
FIG. 20 Plan view (front side) of a wiring substrate according to a fourth embodiment.
Figure 21:
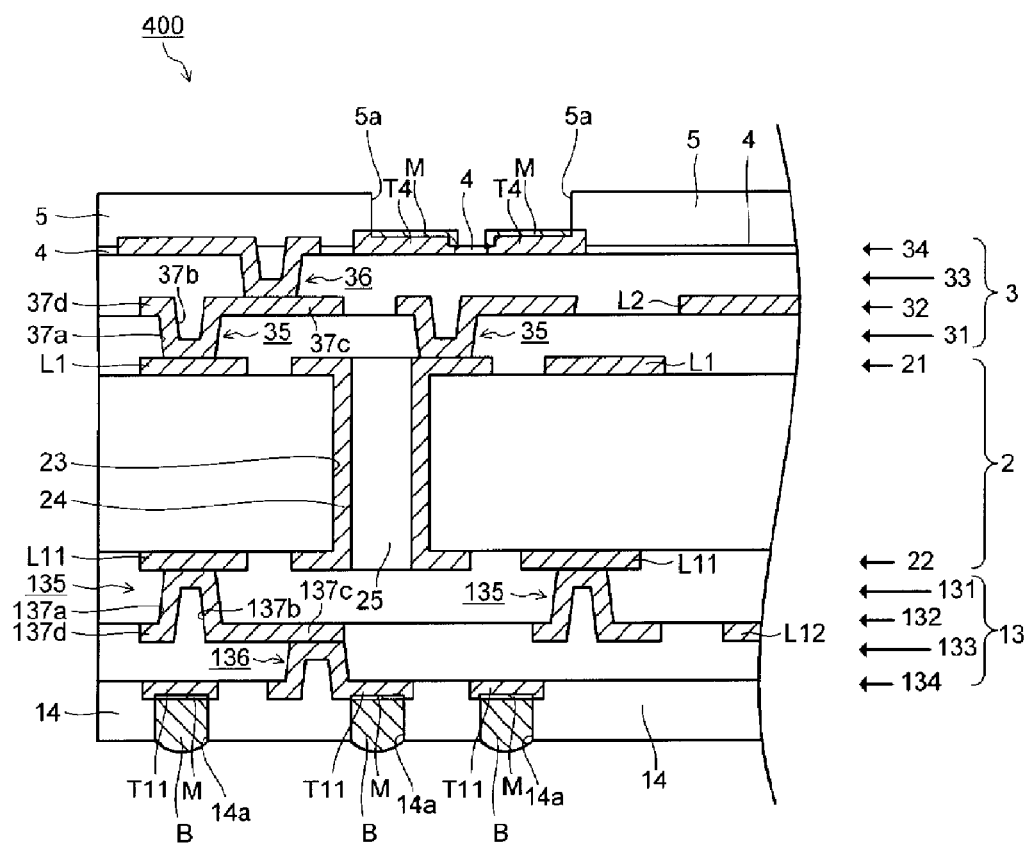
FIG. 21 Fragmentary, sectional view of the wiring substrate according to the fourth embodiment.
Figure 22:
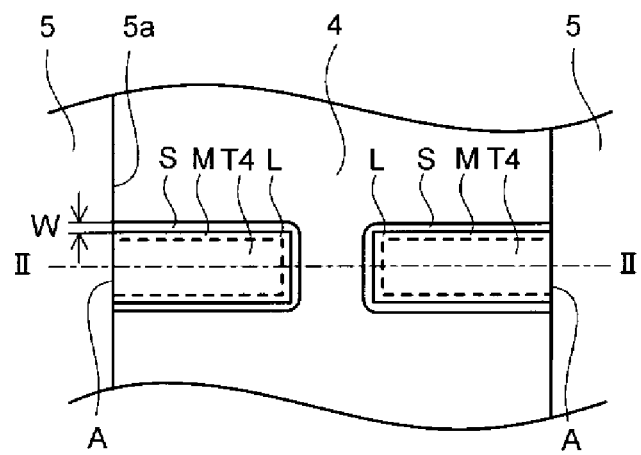
FIG. 22 A pair of configurational views of connection terminals on the front side of the wiring substrate according to the fourth embodiment.
Figure 22:
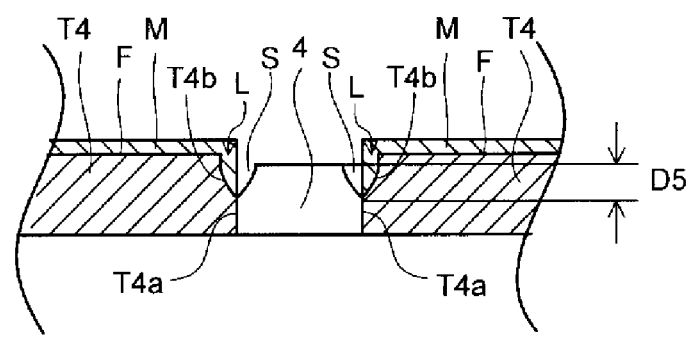

FIG. 20 is a plan view (front side) of a wiring substrate 400 according to a fourth embodiment. FIG. 21 is a fragmentary, sectional view of the wiring substrate 400 taken along line I-I of FIG. 20. FIG. 22 is a pair of configurational views of the front side of the wiring substrate 400. FIG. 22(a) is a top view of the connection terminals T4.

The configuration of the wiring substrate 400 will next be described with reference to FIGS. 20 to 22; however, configurational features similar to those described above with reference to FIGS. 1 to 19 are denoted by like reference numerals, and repeated description thereof is omitted. In the following description, a side of the wiring substrate 400 on which a semiconductor chip is connected is referred to as the front side, and a side on which a motherboard, a socket, or the like (hereinafter, referred to as a motherboard or the like) is connected is referred to as the back side.

The connection terminals T4 of the wiring substrate 400 shown in FIGS. 20 to 22 are used for connection to a semiconductor chip. The connection terminals T4 are of a so-called peripheral type and are disposed along the inner periphery of a semiconductor chip mounting region. The semiconductor chip is electrically connected to the connection terminals T4, thereby being mounted on the wiring substrate 400. In order to improve adhesion to the filling member 4, which will be described later, the connection terminals T4 are roughened at their surfaces.

As shown in FIG. 22, the side surfaces of each of the connection terminals T4 have a contact surface T4a in contact with the filling member 4, and a separation surface T4b separated from the filling member 4 in a region located above the contact surface T4a and below the upper surface of the filling member 4. Also, the contact surface T4a and the separation surface T4b are formed circumferentially along all side surfaces of each of the connection terminals T4 excluding a connection side surface connected to the metal wiring 34 (wiring pattern).

Furthermore, preferably, a gap S between the filling member 4 and the separation surface T4b of each of the connection terminals T4 has a depth D5 of 6 µm or less. Also, preferably, the gap S between the filling member 4 and the separation surface T4b of each of the connection terminals T4 has a width W of 6 µm or less. If at least one of the depth D5 and the width W of the gap S is in excess of 6 µm, the spaces S may fail to be filled with a metal plating layer, solder, underfill, or the like. Thus, conceivably, the metal plating layer, solder, underfill, or the like may fail to function as an anchor for the connection terminals; as a result, the connection terminals T4 may fail to have sufficient bonding strength.

Furthermore, each of the connection terminals T4 has the step L formed at the outer periphery of the first main surface F opposite a contact surface in contact with the resin insulation layer 33 of the build-up layer 3, and the exposed surface of the connection terminal T4 including the step L is covered with the metal plating layer M. In mounting a semiconductor chip on the wiring substrate 400, solder coated on the connection terminals of the semiconductor chip is reflowed, thereby electrically connecting the connection terminals of the semiconductor chip and the corresponding connection terminals T4.

The metal plating layer M is composed of, for example, a single metal layer or a plurality of metal layers selected from among an Ni layer, an Sn layer, an Ag layer, a Pd layer, an Au layer, etc. (e.g., Ni layer/Au layer or Ni layer/Pd layer/Au layer). Also, in place of use of the metal plating layer M, an anticorrosive OSP (Organic Solderability Preservative) treatment may be applied. Also, solder may be coated on the exposed surfaces of the connection terminals T4 including the steps L; furthermore, after the exposed surfaces of the connection terminals T4 including the steps L are covered with the metal plating layer M, the metal plating layer M may be coated with solder.

The filling member 4 may be provided in a filling manner between the connection terminals T4 by any one of the first to fourth filling methods described above in the section of the first embodiment. In the case of employment of the first filling method for providing the filling member 4 in a filling manner between the connection terminals T4, after the heat-cured insulating resin is ground until it becomes lower in level than the connection terminals T4, the gaps S are formed along the side surfaces of the connection terminals T4 excluding connection side surfaces A connected to the metal wiring 34 (wiring pattern). In the case of employment of the third filling method for providing the filling member 4 in a filling manner between the connection terminals T4, after the heat-cured insulating resin is dry-etched, the gaps S are formed along the side surfaces of the connection terminals T4 excluding the connection side surfaces A connected to the metal wiring 34 (wiring pattern). Through formation of the gaps S by these operations, there are formed the contact surfaces T4a in contact with the filling member 4, and the separation surfaces T4b separated from the filling member 4 in a region located above the contact surface T4a and below the upper surface of the filling member 4.

In the case of employment of the second or fourth filling method for providing the filling member 4 in a filling manner between the connection terminals T4, at the time of removal of excess insulating resin, the insulating resin around the side surfaces of the connection terminals T4 are removed in a deeper manner, thereby forming the contact surfaces T4a in contact with the filling member 4, and the separation surfaces T4b separated from the filling member 4 in a region located above the contact surfaces T4a and below the upper surface of the filling member 4. In removing the filling member 4, attention must be paid so as not to excessively remove the filling member 4 until the surface of the resin insulation layer 33, which is the ground for the filling member 4, is exposed.

As described above, in the wiring substrate 400 according to the fourth embodiment, the side surfaces of the front-side connection terminals T4 have the contact surfaces T4a in contact with the filling member 4, and the separation surfaces T4b separated from the filling member 4 in a region located above the contact surfaces T4a and below the upper surface of the filling member 4. Thus, as shown in FIG. 22, when the surfaces of the connection terminals T4 are covered with the metal plating layer M, the metal plating layer M is formed in such a manner as to enter the gaps S between the filling member 4 and the separation surfaces T4b of the connection terminals T4.

Figure 23:
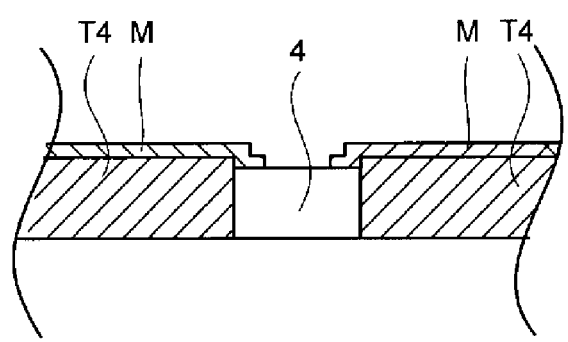
FIG. 23 Configurational view of connection terminals on the front side of a wiring substrate according to a comparative example.

Thus, the state shown in FIG. 23 can be prevented; specifically, there can be prevented the state in which the metal plating layer M projects onto the surface of the filling member 4; i.e., the spacing between the metal plating layers formed respectively on the surfaces of the adjacent connection terminals T4 is narrowed. Therefore, in coating solder on the connection terminals T4 or in mounting a semiconductor chip, there can be prevented the occurrence of a short circuit between the connection terminals T4 which could otherwise result from flow of solder toward the adjacent connection terminal T4.

Also, when the connection terminals T4 are coated with solder, solder enters the gaps between the filling member 4 and the separation surfaces T4b of the connection terminals T4. Therefore, there can be prevented the occurrence of a short circuit between the connection terminals T4 which could otherwise result from flow of solder coated on the connection terminal T4 toward the adjacent connection terminal T4.

Also, the above-mentioned metal plating layer M and solder, and underfill used in mounting a semiconductor chip enter the gaps S. Since the metal plating layer M, solder, and underfill which have entered the gaps S function as anchors for the connection terminals T4, sufficient bonding strength can be obtained. This anchoring function can prevent potential separation of the connection terminals T4 in the course of manufacture.

Also, the contact surface T4a and the separation surface T4b are formed circumferentially along all side surfaces of each of the connection terminals T4 excluding the connection side surface A connected to the wiring pattern. Thus, there can be prevented the occurrence of a short circuit between the connection terminals T4 along all side surfaces of the connection terminals T4 which could otherwise result from flow of solder, or the like. Other effects which the wiring substrate 400 yields are similar to those yielded by the wiring substrate 100 according to the first embodiment.

Modification of the Fourth Embodiment

Figure 24:
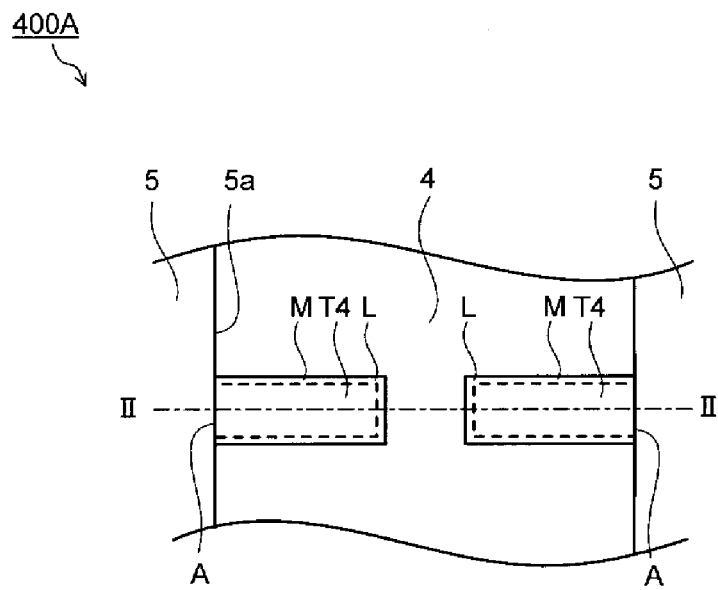
FIG. 24 A pair of configurational views of connection terminals on the front side of a wiring substrate according to modification of the fourth embodiment.
Figure 24:
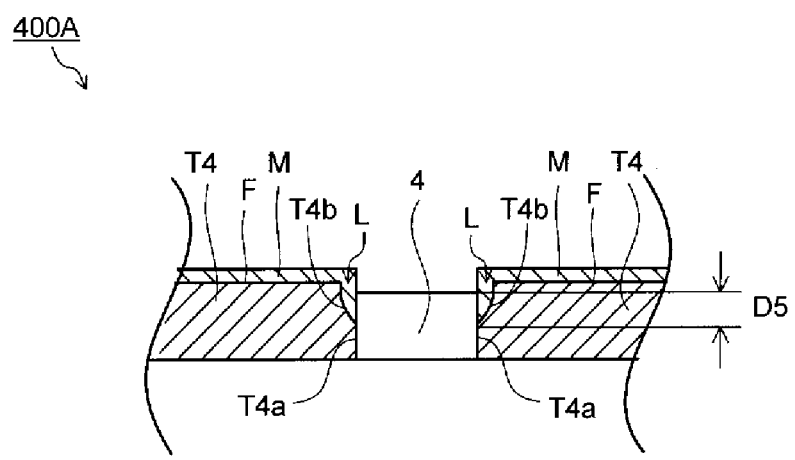

FIG. 24 is a pair of configurational views of connection terminals formed on the front side of a wiring substrate 400A according to modification of the fourth embodiment. The configuration of the wiring substrate 400A according to modification of the fourth embodiment will next be described with reference to FIG. 24; however, configurational features similar to those of the wiring substrate 400 according to the fourth embodiment described above with reference to FIGS. 20 to 23 are denoted by like reference numerals, and repeated description thereof is omitted.

In the case of the wiring substrate 400 according to the fourth embodiment described above with reference to FIGS. 20 to 23, the gaps S are formed at the time of forming the filling member 4 in a filling manner; subsequently, the metal plating layer M is formed. Thus, a gap remains between the filling member 4 and the metal plating layer M.

By contrast, as shown in FIG. 24, the metal plating layer M can be formed on the connection terminals T4 in such a manner that no gap is formed between the filling member 4 and the metal plating layer M. In this case, the gaps S are not formed at the time of forming the filling member 4 in a filling manner, but the gaps are formed between the connection terminals T4 and the side surfaces of the filling member 4 by etching the connection terminals T4. By filling the gaps with the metal plating layer M, the wiring substrate 400A shown in FIG. 24 can be yielded. In place of formation of the metal plating layer M, by coating solder on the exposed surfaces of the connection terminals T4, the gaps can be filled with solder.

Also, even though the connection terminals T4 are not etched, by means of the metal plating layer M being formed on the connection terminals T4 by electroless displacement plating, there can be yielded the wiring substrate 400A in which, as shown in FIG. 24, no gap is formed between the filling member 4 and the metal plating layer M.

Fifth Embodiment

Figure 25:
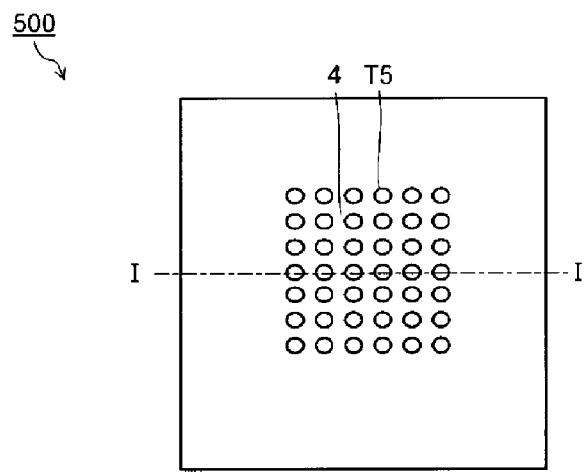
FIG. 25 Plan view (front side) of a wiring substrate according to a fifth embodiment.
Figure 26:
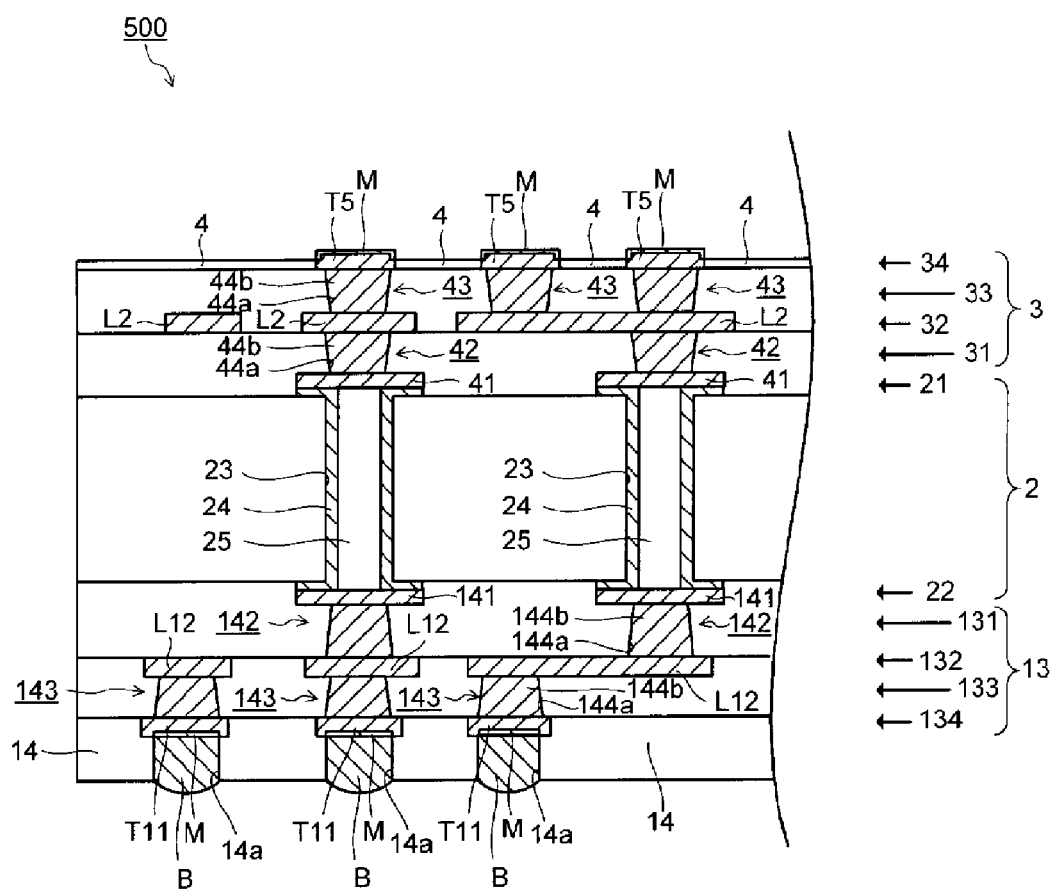
FIG. 26 Fragmentary, sectional view of the wiring substrate according to the fifth embodiment.
Figure 27:
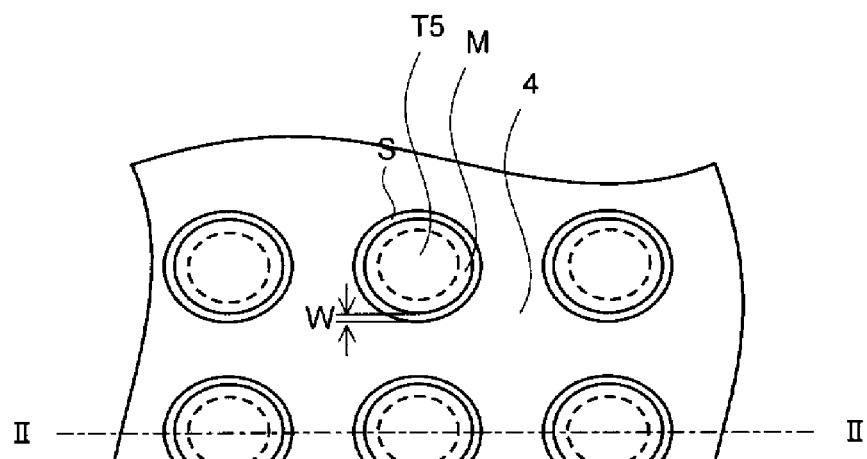
FIG. 27 A pair of configurational views of connection terminals on the front side of the wiring substrate according to the fifth embodiment.
Figure 27:
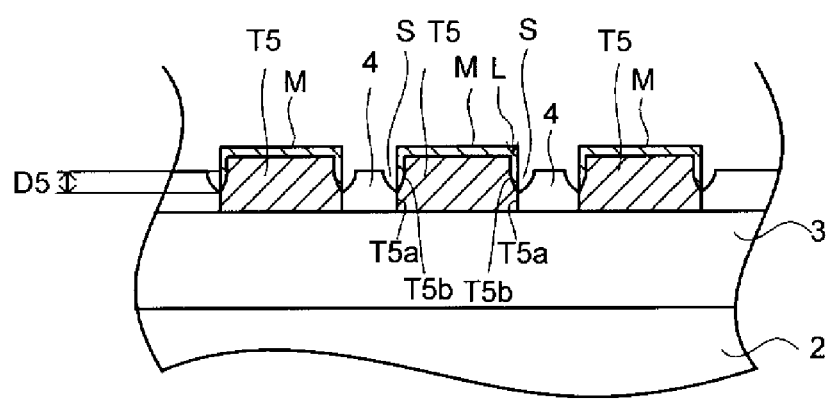

FIG. 25 is a plan view (front side) of a wiring substrate 500 according to a fifth embodiment. FIG. 26 is a fragmentary, sectional view of the wiring substrate 500 taken along line I-I of FIG. 25. FIG. 27 is a pair of configurational views of connection terminals T5 formed on the front side of the wiring substrate 500. FIG. 27($a$) is a top view of the connection terminals T5. FIG. 27($b$) is a sectional view taken along line II-II of FIG. 27($a$).

The side surfaces of each of the connection terminals T5 of the wiring substrate 500 according to the fifth embodiment have a contact surface T5$a$ in contact with the filling member 4, and a separation surface T5$b$ separated from the filling member 4 in a region located above the contact surface T5$a$ and below the upper surface of the filling member 4. The contact surface T5$a$ and the separation surface T5$b$ are formed circumferentially along all side surfaces of each of the connection terminals T5.

Furthermore, preferably, the gap S between the filling member 4 and the separation surface T5$b$ of each of the connection terminals T5 has a depth D5 of 6 μm or less. Also, preferably, the gap S between the filling member 4 and the separation surface T5$b$ of each of the connection terminals T5 has a width W of 6 μm or less. If at least one of the depth D5 and the width W of the gap S is in excess of 6 μm, the spaces S may fail to be filled with a metal plating layer, solder, underfill, or the like. Thus, conceivably, the metal plating layer, solder, underfill, or the like may fail to function as an anchor for the connection terminals; as a result, the connection terminals T5 may fail to have sufficient bonding strength.

Other configurational features are similar to those of the wiring substrate 200 described above with reference to FIGS. 12 to 14. Thus, configurational features similar to those of the wiring substrate 200 described above with reference to FIGS. 12 to 14 are denoted by like reference numerals, and repeated description thereof is omitted. Also, the wiring substrate 500 yields effects similar to those yielded by the wiring substrate 200 according to the second embodiment and the wiring substrate 400 according to the fourth embodiment.

Similar to the case of the wiring substrate 400A according to modification of the fourth embodiment described above with reference to FIG. 24, it may be the case that the metal plating layer M is formed or solder is coated on the connection terminals T5 without formation of the gaps S at the time of forming the filling member 4 in a filling manner.

Sixth Embodiment

Figure 28:
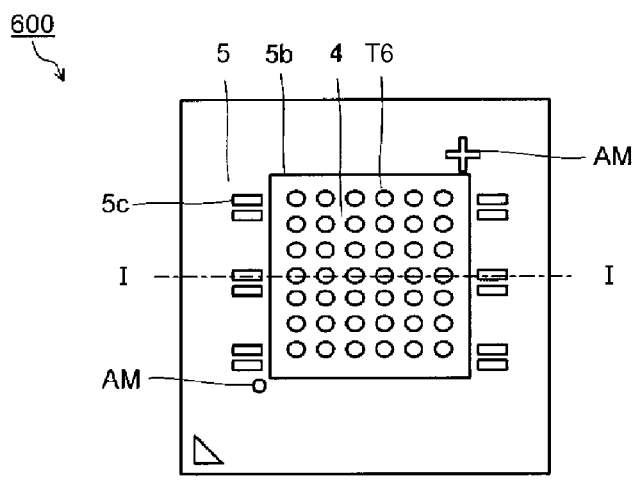
FIG. 28 Plan view (front side) of a wiring substrate according to a sixth embodiment.
Figure 29:
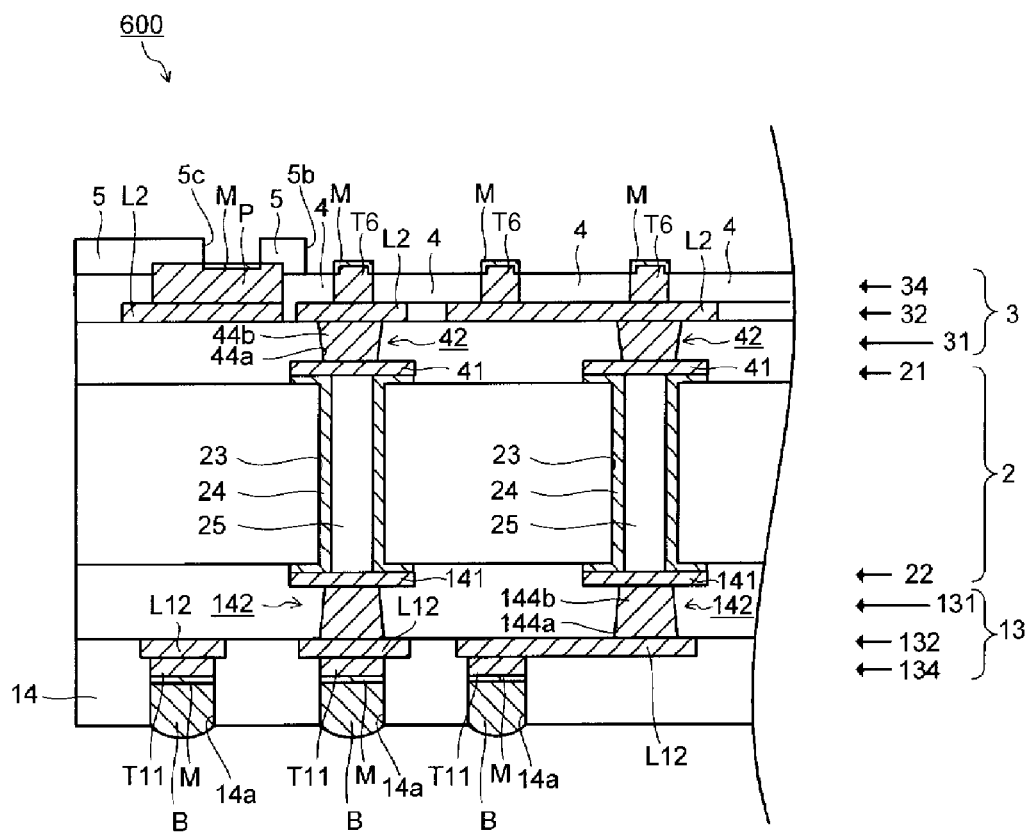
FIG. 29 Fragmentary, sectional view of the wiring substrate according to the sixth embodiment.
Figure 30:
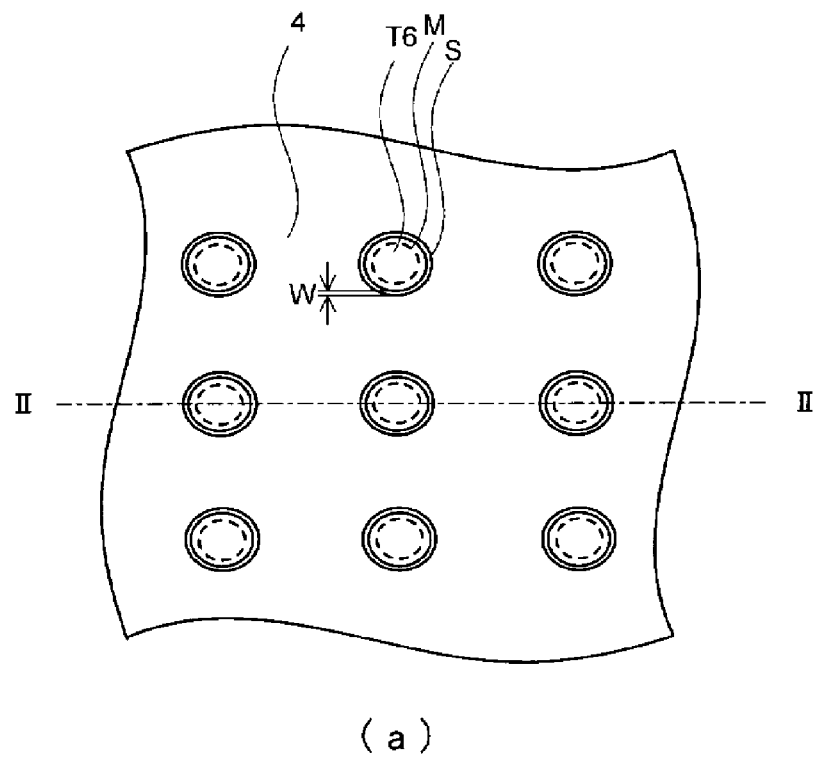
FIG. 30 A pair of configurational views of connection terminals on the front side of the wiring substrate according to the sixth embodiment.
Figure 30:
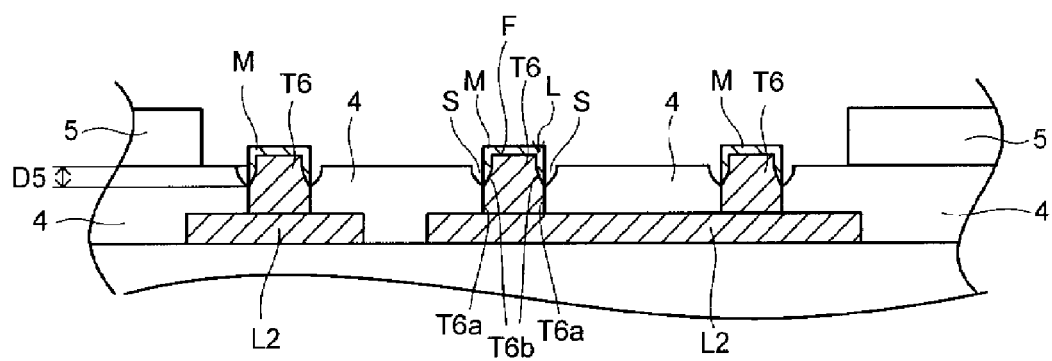

FIG. 28 is a plan view (front side) of a wiring substrate 600 according to a sixth embodiment. FIG. 29 is a fragmentary, sectional view of the wiring substrate 600 taken along line I-I of FIG. 28. FIG. 30 is a pair of configurational views of connection terminals T6 formed on the front side of the wiring substrate 600. FIG. 30($a$) is a top view of the connection terminals T6. FIG. 30($b$) is a sectional view taken along line II-II of FIG. 30($a$).

The side surfaces of each of the connection terminals T6 of the wiring substrate 600 according to the sixth embodiment have a contact surface T6$a$ in contact with the filling member 4, and a separation surface T6$b$ separated from the filling member 4 in a region located above the contact surface T6$a$ and below the upper surface of the filling member 4. The contact surface T6$a$ and the separation surface T6$b$ are formed circumferentially along all side surfaces of each of the connection terminals T6.

Furthermore, preferably, the gap S between the filling member 4 and the separation surface T6$b$ of each of the connection terminals T6 has a depth D5 of 6 μm or less. Also, preferably, the gap S between the filling member 4 and the separation surface T6$b$ of each of the connection terminals T6 has a width W of 6 μm or less. If at least one of the depth D5 and the width W of the gap S is in excess of 6 μm, the spaces S may fail to be filled with a metal plating layer, solder, underfill, or the like. Thus, conceivably, the metal plating layer, solder, underfill, or the like may fail to function as an anchor for the connection terminals; as a result, the connection terminals T6 may fail to have sufficient bonding strength.

Other configurational features are similar to those of the wiring substrate 300 described above with reference to FIGS. 15 to 17. Thus, configurational features similar to those of the wiring substrate 300 described above with reference to FIGS. 15 to 17 are denoted by like reference numerals, and repeated description thereof is omitted. Also, the wiring substrate 600 yields effects similar to those yielded by the wiring substrate 300 according to the third embodiment and the wiring substrate 400 according to the fourth embodiment.

Similar to the case of the wiring substrate 400A according to modification of the fourth embodiment described above with reference to FIG. 24, it may be the case that the metal plating layer M is formed or solder is coated on the connection terminals T6 without formation of the gaps S at the time of forming the filling member 4 in a filling manner.

Another Embodiment

Figure 31:
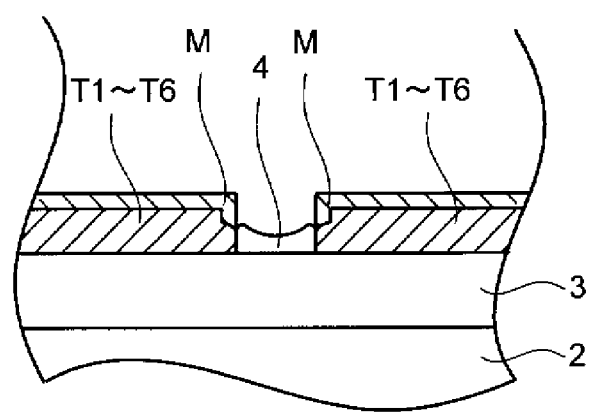
FIG. 31 View showing the shape of the upper surface of a filling member of a wiring substrate according to another embodiment.

In the wiring substrate 100 described above with reference to FIGS. 1 to 3, the wiring substrate 200 described above with reference to FIGS. 12 to 14, the wiring substrate 300 described above with reference to FIGS. 15 to 17, the wiring substrate 400 described above with reference to FIGS. 20 to 22, the wiring substrate 500 described above with reference to FIGS. 25 to 27, and the wiring substrate 600 described above with reference to FIGS. 28 to 30, the filling member 4 provided in a filling manner between the connection terminals T1 to T6 has a flat upper surface; however, the upper surface of the filling member 4 is not necessarily flat; for example, even when the filling member 4 has a roundish upper shape, or a so-called fillet shape, as shown in FIG. 31, similar effects can be yielded.

While the present invention has been described in detail with reference to the embodiments, the present invention is not limited thereto. Various and numerous modifications and changes can be made without departing from the scope of the present invention. For example, the above embodiments are described while mentioning the wiring substrates 100 to 600 in the form of a BGA substrate which is to be connected to a motherboard or the like via the solder balls B; however, the wiring substrates 100 to 600 may have pins or lands in place of the solder balls B, for connection to a motherboard or the like, to thereby assume the form of a so-called PGA (Pin Grid Array) substrate or a so-called LGA (Land Grid Array) substrate.

Also, in the above-described embodiments, in the case of employment of the first filling method or the second filling method, after the filling member 4 is formed, the solder resist layer 5 is formed; however, it may be the case that, after the solder resist layer 5 is formed, the filling member 4 is formed.

INDUSTRIAL APPLICABILITY

The wiring substrate of the present invention is configured to prevent the occurrence of a short circuit between the connection terminals and to implement a fine-pitch disposition of the connection terminals.

DESCRIPTION OF REFERENCE NUMERALS 100-600: wiring substrate; 2: core substrate; 3: build-up layer; 4: filling member; 5: solder resist layer; 5a: opening; 13: build-up layer; 14: solder resist layer; 14a: opening; 21, 22: core conductive-layer; 23: through-hole; 24: through-hole conductor; 25: resin filler; 31, 33: resin insulation layer; 32, 34: conductive layer; 35, 36: via; 37a: via hole; 37b: via conductor; 37c: via pad; 37d: via land; 41: cover plating layer; 42, 43: filled via; 44a: via hole; 44b: via conductor; 131, 133: resin insulation layer; 132, 134: conductive layer; 135, 136: via; 137a: via hole; 137b: via conductor; 137c: via pad; 137d: via land; 141: cover plating layer; 142, 143: filled via; 144a: via hole; 144b: via conductor; B: solder ball; F: main surface; L: step; L1, L2: metal wiring; L11, L12: metal wiring; M: metal plating layer; T1 to T6, T4a to T6a: contact surface; T4b to T6b: separation surface: T11: connection terminal; AM: alignment mark; P: pad; MR1, MR2, MR11, MR12: plating resist; and S: gap.

What is claimed is:

1. A wiring substrate comprising a laminate of one or more insulation layers and one or more conductive layers, characterized by further comprising:
    a plurality of connection terminals formed directly on one of the one or more insulation layers of the laminate and spaced apart from one another, each having an indentation formed at an outer periphery of a first main surface opposite a contact surface in contact with the laminate; and
    a filling member provided in a filling manner between the connection terminals,
    wherein the filling member is a solder resist layer,
    wherein the connection terminals project at least partially from a surface of the filling member,
    wherein the laminate is covered with a solder resist layer having an opening from which the plurality of connection terminals are exposed, and covering a wiring pattern connected to the connection terminals, and
    wherein the plurality of connection terminals are disposed within the same opening.

2. A wiring substrate according to claim 1, wherein the filling member is in contact with at least a portion of side surfaces of each of the connection terminals.

3. A wiring substrate according to claim 1, wherein at least a portion of the contact surface of each of the connection terminals is roughened and the portion of the contact surface that is roughened is in contact with the filling member.

4. A wiring substrate according to claim 1, wherein the connection terminals have a columnar shape.

5. A wiring substrate according to claim 1, wherein a side surface of each of the connection terminals has a contact surface in contact with the filling member, and a separation surface separated from the filling member in a region located above the contact surface and below an upper surface of the filling member.

6. A wiring substrate according to claim 5, wherein the contact surface and the separation surface are formed circumferentially along all side surfaces of each of the connection terminals excluding a connection side surface connected to a wiring pattern.

7. A wiring substrate according to claim 5, wherein the contact surface and the separation surface are formed circumferentially along all side surfaces of each of the connection terminals.

8. A wiring substrate according to claim 5, wherein a gap between the separation surface and the filling member has a depth of 6 μm or less.

9. A wiring substrate according to claim 5, wherein a gap between the separation surface and the filling member has a width of 6 μm or less.

* * * * *